United States Patent
Kudo et al.

(10) Patent No.: US 12,360,453 B2
(45) Date of Patent: Jul. 15, 2025

(54) PAG-FREE POSITIVE CHEMICALLY AMPLIFIED RESIST COMPOSITION AND METHODS OF USING THE SAME

(71) Applicant: Merck Patent GmbH, Darmstadt (DE)

(72) Inventors: Takanori Kudo, Bedminster, NJ (US); Hung-Yang Chen, Somerset, NJ (US)

(73) Assignee: Merck Patent GmbH, Darmstadt (DE)

( * ) Notice: Subject to any disclaimer, the term of this patent is extended or adjusted under 35 U.S.C. 154(b) by 644 days.

(21) Appl. No.: 17/762,597

(22) PCT Filed: Nov. 17, 2020

(86) PCT No.: PCT/EP2020/082356
§ 371 (c)(1),
(2) Date: Mar. 22, 2022

(87) PCT Pub. No.: WO2021/099298
PCT Pub. Date: May 27, 2021

(65) Prior Publication Data
US 2022/0404702 A1 Dec. 22, 2022

Related U.S. Application Data

(60) Provisional application No. 62/937,459, filed on Nov. 19, 2019.

(51) Int. Cl.
*G03F 7/039* (2006.01)
*G03F 7/022* (2006.01)
(Continued)

(52) U.S. Cl.
CPC ............ *G03F 7/0392* (2013.01); *G03F 7/022* (2013.01); *G03F 7/023* (2013.01); *G03F 7/0236* (2013.01); *G03F 7/2002* (2013.01)

(58) Field of Classification Search
CPC ......... G03F 7/022; G03F 7/023; G03F 7/0236
See application file for complete search history.

(56) References Cited

U.S. PATENT DOCUMENTS 4,015,986 A  4/1977 Paal et al.
4,816,115 A  3/1989 Hoerner et al.
(Continued)

FOREIGN PATENT DOCUMENTS

CN  103149795 A  6/2013
CN  104965389 A  10/2015
(Continued)

OTHER PUBLICATIONS

English translation of JP2013140336. (Year: 2013).*
(Continued)

*Primary Examiner* — Mark F. Huff
*Assistant Examiner* — Anna Malloy
(74) *Attorney, Agent, or Firm* — EMD Performance Materials Corp.

(57) ABSTRACT

A resist composition which has as components a phenolic resin component, a photoactive 2,1,5-diazonaphthoquinone-sulfonate component (PAC), a solvent component and that does not contain a photo acid generator (PAG). The PAC is a free PAC, a coupled PAC (PACb) or a combination thereof that includes a substituted or unsubstituted 2,1,5-DNQ material or compound onto which a substituted or unsubstituted 2,1,5-DNQ material is appended that, when UV exposed, do not form sulfonic acid. The phenolic resin component is a Novolak derivative in which some or all the free hydroxy groups are protected with an acid cleavable acetal moiety which can include a PACb moiety. A method whereby this composition is used in either thick or thin film photoresist device manufacturing methodologies.

21 Claims, 13 Drawing Sheets

(51) Int. Cl.
*G03F 7/023* (2006.01)
*G03F 7/20* (2006.01)

(56) References Cited

U.S. PATENT DOCUMENTS

| | | | |
|---|---|---|---|
| 5,087,547 A * | 2/1992 | Taylor | G03F 7/0226 430/169 |
| 5,139,918 A | 8/1992 | Goel | |
| 5,529,880 A | 6/1996 | Zampini et al. | |
| 5,612,164 A | 3/1997 | Canize et al. | |
| 5,714,559 A | 2/1998 | Schacht et al. | |
| 5,853,947 A | 12/1998 | Wanat et al. | |
| 6,051,370 A | 4/2000 | Kim | |
| 6,645,851 B1 | 11/2003 | Ho et al. | |
| 7,255,972 B2 | 8/2007 | Nishiwaki et al. | |
| 8,715,918 B2 | 5/2014 | Toukhy et al. | |
| 2001/0018497 A1 * | 8/2001 | Furihata | C08G 8/30 528/158 |
| 2002/0120070 A1 | 8/2002 | Hong et al. | |
| 2002/0127887 A1 | 9/2002 | Uehara et al. | |
| 2003/0054292 A1 | 3/2003 | Choi et al. | |
| 2003/0134223 A1 * | 7/2003 | Katano | G03F 7/0236 430/326 |
| 2004/0185387 A1 | 9/2004 | Benson et al. | |
| 2004/0197696 A1 * | 10/2004 | Eilbeck | G03F 7/023 430/326 |
| 2005/0244740 A1 * | 11/2005 | Maruyama | G03F 7/0392 430/283.1 |
| 2007/0020558 A1 | 1/2007 | Zahn et al. | |
| 2008/0182204 A1 | 7/2008 | Calvert et al. | |
| 2009/0081589 A1 | 3/2009 | Toukhy et al. | |
| 2010/0233434 A1 | 9/2010 | Lahav et al. | |
| 2011/0111341 A1 | 5/2011 | Kim et al. | |
| 2014/0030881 A1 | 1/2014 | Lee et al. | |
| 2014/0154624 A1 * | 6/2014 | Liu | G03F 7/0045 430/326 |
| 2015/0301452 A1 | 10/2015 | Park et al. | |
| 2016/0291468 A1 | 10/2016 | Sato | |
| 2022/0404702 A1 * | 12/2022 | Kudo | G03F 7/023 |

FOREIGN PATENT DOCUMENTS

| | | | | |
|---|---|---|---|---|
| EP | 0295626 A2 | 12/1988 | | |
| EP | 0447868 A1 | 9/1991 | | |
| JP | H04-219757 A | 8/1992 | | |
| JP | 08095240 A * | 4/1996 | | |
| JP | H08-181132 A | 7/1996 | | |
| JP | 2008-046594 A | 2/2008 | | |
| JP | 2013140336 A * | 7/2013 | ........... | G02F 1/1303 |
| KR | 10-2012-0073988 A | 7/2012 | | |
| TW | 200300521 A | 6/2003 | | |
| WO | 93/18438 A1 | 9/1993 | | |
| WO | 97/33206 A1 | 9/1997 | | |
| WO | 9735231 A2 | 9/1997 | | |
| WO | 2019/224248 A1 | 11/2019 | | |

OTHER PUBLICATIONS

English translation of JP08095240. (Year: 1996).*
Office Action received for Chinese Patent Application No. 202080078107.1 mailing date Sep. 4, 2024, 17 Pages (09 pages of English Translation Pages & 08 Pages of Official Copy).
Bantu et al., "Design and Process of a New DUV ARCH3 Resist", Proceedings of SPIE—The International Society for Optical Engineering, Advances in Resist Technology and Processing XIV, vol. 3049, 1997, 15 Pages.
Dammel, Ralph, "Diazonapthoquinone-based Resists", SPIE Optical Engineering Press, Chapters 2 and 3, vol. TT 11, 1993, 90 Pages.
Hayase et al., "Photosensitive polyimides consisting of simple mixtures of 4-substituted diazonaphthoquinones and polyamic acids", Polymers for Advanced Technologies, vol. 4, 1992, pp. 302-308.
Lee et al., "Chemically Amplified i-Line Positive Resist for Next-Generation Flat Panel Display", Proceedings of SPIE, vol. 10146, 2017, 7 Pages.
International Search Report and Written Opinion received for PCT Application No. PCT/EP2020/082356, mailed on Feb. 26, 2021, 10 Pages.
Toukhy et al., "Chemically Amplified Resist Technology For i-Line Applications", SPIE, vol. 3333, 1998, pp. 1212-1217.
Yabu et al., "High-Resolution Technology for FPD Manufacturing", Journal of the Society for Information Display, vol. 23, No. 6, 2015, pp. 246-252.

* cited by examiner

In which D = H or a moiety selected from [...] where at least one D in a given PAC is not H.

2μm L/S    1μm L/S    0.8μm L/S

PAG-FREE POSITIVE CHEMICALLY AMPLIFIED RESIST COMPOSITION AND METHODS OF USING THE SAME

This application is a national stage application, filed under 35 U.S.C. § 371, of International Patent Application No. PCT/EP2020/082356 (filed on 17 of November 2020) which claims the benefit of U.S. Provisional Patent Application No. 62/937,459 (filed on 19 Nov. 2019) each of which applications is incorporated herein by reference in their entirety.

FIELD

The disclosed subject matter pertains to a positive radiation-sensitive aqueous base soluble photoresist composition used for making integrated circuit (IC), light emitting diode (LED) devices and display devices.

BACKGROUND

Photoresist compositions are used in microlithographic processes for making miniaturized electronic components such as in the fabrication of computer chips, integrated circuits, light emitting diode (LED) devices and displays. Generally, in these processes, a film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When positive-working photoresist compositions are exposed image-wise to radiation, the areas of the resist composition exposed to the radiation become more soluble to a developer solution (e.g., release of base solubilizing group or photo-decomposition of dissolution inhibitor), while the unexposed areas of the photoresist coating remain relatively insoluble to such a solution. Thus, treatment of an exposed positive-working resist with a developer causes removal of the exposed areas of the photoresist coating and the creation of a positive image in the coating, thereby uncovering a desired portion of the underlying substrate surface on which the photoresist composition was deposited.

The use of a positive-working, sensitive photoresist composition which is developable by aqueous base is known in the prior art. Most of such prior art pertains either to either chemically amplified photoresist based on either phenolic or (meth)acrylate resin, or non-chemically amplified photoresists based on Novolak/diazonaphthoquinone. In Novolak/diazonaphthoquinone photoresist a positive image is formed through the photodecomposition of the diazonaphthoquinone compound (PAC) which in resist areas exposed leads to a faster dissolution of the Novolak resin in aqueous base, these types of photoresists are employed at longer UV wavelengths such with i-line (365 nm), and were for many years workhorse photoresists in the manufacturing of integrated circuits (IC).

In chemically amplified positive photoresist a base soluble resin, usually a phenolic resin or (meth)acrylate resin, is released in areas of the resist exposed to radiation, rendering it aqueous base developable, by an acid catalyzed cleavage of protecting groups on these resins, originally masking the base solubilizing moieties. In these chemically amplified photoresists, the catalytic acid is formed by photo-decomposition of photo-acid generator (PAG) component. These types of resists are typically employed at shorter wavelengths in quest for higher resolution in the manufacture of IC's.

For thick film applications, conventional (diazonaphthoquinone) DNQ/Novolak resist platform produce sloped profiles, particularly at thicker films due to their high film absorption. Positive chemically amplified (CA) platforms, on the other hand can provide adequate performance over 5 to 10 μm film thickness, however the polymer conventionally used for these resists, are much more expensive than conventional Novolak resins. Also, certain designs for positive chemically amplified resists which require a post exposure bake may have a deleteriously effect on IC device throughput. Cost and device throughput are also an issue for applications pertaining to the manufacture of displays, however, here the thickness requirements for resists in this application are lower (1 to 3 μm). The potential effect on device throughput issue occurs in certain chemically amplified resists in which the protecting group, masking the base solubilizing moiety, have a high activation energy acid for their cleavage, in order unmask the base solubilizing moiety. Thus although, these high activation energy groups are removable catalytically by acid, this removal requires a post exposure bake step, which is time consuming. Also, in high activation energy, positive chemically amplified resist, there is also an issue with sensitivity to airborne base contamination, associated with this design. This is since in order to have good resolution these resists have a high degree of non-linearity between the extent of cleavage of the high activation energy group and dissolution of an exposed resist film. Thus, even a small depletion of acid at the surface after exposure, will in the delay time between exposure and bake case a lower degree of deprotection of these groups at the surface which will manifest itself as an insoluble resist surface layer. This is post-exposure delay effect is called T-topping because of the resulting positive images formed have a large undesirable T-shape, which causes defects in manufacturing, and lower device yields.

One aspect of the disclosed subject matter is to provide a cost competitive, resist system based on a hybrid between conventional chemically amplified systems and a Novolak diazonaphthoquinone which may be employed either in relatively thin film (1 to 2 μm) applications in the manufacture of displays, but is also flexible enough to be used in thick film applications (3-10 μm) that does not include or require a photoacid generator (PAG) and does not require a post exposure bake (PEB) in thin film applications and some thicker film applications.

This disclosed subject matter describes a novel resist which is a hybrid between a conventional Novolak/DNQ resist and a chemically amplified resist that does not include a photoacid generator (PAG). Specifically, this hybrid is one in which Novolak polymer has its phenol functional groups partially blocked with an acetal group. This type of acetal polymer is produced by reacting both the Novolak and DNQ compound for instance with a mono-vinyl ether and/or di-vinylether (DVE) typically at low temperature. Additionally, in one variation of this novel hybrid resist system the acetal derived from a mono-vinyl ether protecting group may be functionalized with a DNQ moiety whose functionalization attachment point may either be through a non-acid sensitive linking group or through a second acid cleave able acetal moiety.

In some variations for thick film applications, these novel hybrids may incorporate low levels of DNQ down to ~4 wt. %. In these applications such variations ensure low absorption of UV light in the resist film giving, these hybrid systems, utility in low thickness application, such as in the manufacture in IC devices requiring thick films. Specifically, conventional DNQ resist typically contain 17-30% DNQ to obtain sufficient dissolution inhibition and contrast. Thus, standard Novolak/DNQ resist have an absorption per μm much higher than in the novel hybrid system described herein. Thus, while standard Novolak/DNQ undergo bleaching of the DNQ photoactive moiety (PAC), this bleaching is insufficient in thick film application, resulting in the PAC remaining unbleached to a large extent deeper into the thick film. This causes resist profiles to have sloped or scummed profiles, deleteriously affecting device yields. Also, in the novel hybrid resist system, described herein, the amount of acetal protection used is relatively low when using a divinyl ether protecting group approach (e.g., less than 7% moles % protection of the total phenol moieties in the Novolak is required. Thus, for thick film applications this new platform provides high inhibition system using much lower levels of DNQ with low absorption, and lower protection group % protection compared to conventional chemically amplified systems. Consequently, the thick film embodiment of the disclosed subject matter by providing resist images with straight wall profiles solves the problem of sloping profiles which occur in conventional Novolak/DNQ systems.

In display applications, requiring a thinner resist film, the novel hybrid resist systems described herein may be formulated with Novolaks having more monovinyl ether protection, and higher amounts of DNQ PAC, as absorbance is not as crucial. Advantageously, this approach provides for thin film photoresists which have high resolution, contrast, but which do not require a post exposure bake (PEB), increasing manufacturing throughput and reducing the possibility of deleterious post exposure delay effects such as formation of featuring having a large extent of T-topping. Although not bound by theory, a PEB may not be required, because the low activation energy acetal protecting groups, coupled with the thinner films in these applications, may help in assuring that the resist film in exposed areas, is fully deprotected during the exposure phase, removing the necessity of a such a bake.

Also, since the acetal groups undergo deprotection during exposure there is no need to include a PAG (whether an additionally provided PAG or one, such as sulfonic acid, formed in situ). Thus, this deprotection during exposure, may decrease the opportunity for airborne contaminant to consume photo acid at exposed resist surfaces, avoiding post-exposure delay effects in thin film resists such as severe T-topping of imaged resist features. This is an important problem to solve as severe T-topping of imaged resist features can affect device yield. Also, being able to forgo the PEB in the inventive thin film embodiments of the disclosed subject matter allows for solving the problem of increase device throughput by decreasing processing time.

Finally, in either the thick film or thin film variations of this novel hybrid resist system these are low cost resist platforms that are simple to prepare, directly, without polymer extraction or isolation after the reaction.

Significantly, as alluded to above, the disclosed and claimed resist compositions described herein differ from those disclosed in International Patent application PCT/EP2019/063216 in that these compositions described herein exclusively utilize 2,1,5 diazonaphthoquinonesulfonate of a phenolic moiety (a.k.a. 6-diazo-5-oxo-5,6-dihydronaphthalene-1-sulfonate of a phenolic moiety) and derivatives thereof (e.g., larger mono or polyphenolic molecules incorporating these 2,1,5 diazonaphthoquinonesulfonate) as a photoactive compound (PAC). Importantly, these 2,1,5 diazonaphthoquinonesulfonate PAC compounds, when exposed to UV light do not generate sulfonic acid, but only an indenecarboxylic acid having a pKa of about 3.4 or higher. As such, the disclosed and claimed resist compositions do not require or include a photo acid generator (PAG) materials (a.k.a. materials which photo-generate upon UV exposure strong acids having a $pK_a$ of about 2 and lower, such as arylsulfonic acids, alkylsulfonic, perfluoroalkylsulfonic acid, HCl, HBr, $HAsF_6$, tris(perfluoroalkylsulfonyl)carbides, bis(perfluoroalkylsulfonyl)amides, tetrafluoroalkylborate, and the like).

Although, the deprotection of the acetal protecting groups occurs in situ during UV exposure, without a post-exposure bake (PEB) for thinner film applications, optionally for some very thin films a PEB may be required to develop the resist due to insufficient deblocking at room temperature during UV exposure in these thicker films.

SUMMARY

The resist compositions disclosed and claimed herein are chemically amplified resist compositions that include:
(i) a phenolic resin component,
(ii) one or more photoactive non-acid generating photoactive 2,1,5-diazonaphthoquinonesulfonate compounds (PAC) component ("DNQ-PAC component");
(iii) a solvent component; and
(iv) one or more optional ingredients,
where the resist compositions do not include an added PAG.

In a further embodiment, the resist compositions disclosed and claimed herein consist essentially of the forgoing ingredients in varying concentrations without the presence of an added PAG. In such an embodiment, the combined amounts of the ingredients do not equal 100% by weight and can include other ingredients that do not materially change the effectiveness of the resist composition.

In a still further embodiment, the resist compositions disclosed and claimed herein consist of ingredients (i), (ii) and (iii) in varying concentrations. In such an embodiment, the combined amounts of ingredients (i), (ii) and (iii) equal approximately 100% by weight but may include other small and/or trace amounts of impurities that are present in such small quantities that they do not materially change the effectiveness of the resist composition.

Notably, the resist compositions disclosed and claimed herein do not require or include a photo acid generator (PAG) in order to deprotect the phenolic resin and also do not require a post-exposure bake (PEB) step when used in certain lithographic processes/applications (e.g., in thin film applications).

The phenolic resin is a Novolak-derived resin or a hydroxystyrene-derived resin. Theses resins include free hydroxy groups as well as protected hydroxy groups. The protected hydroxy groups are protected by acid labile monofunctional or substituted acetal groups that can also provide, in different embodiments, crosslinking between different polymer chains of the phenolic resin.

The DNQ-PAC component is one or more of (i) the acetal moiety functionalized with a PAC moiety or a compound including a PAC moiety (referred herein as "PACb") and (ii) a free PAC component (i.e., a PAC or compound including a PAC moiety) that is not a component of the acetal moiety.

The disclosed subject matter also pertains to the method of coating the resist compositions on a substrate as part of a lithographic process.

BRIEF DESCRIPTION OF THE FIGURES

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings.

DETAILED DESCRIPTION

Figure 1:
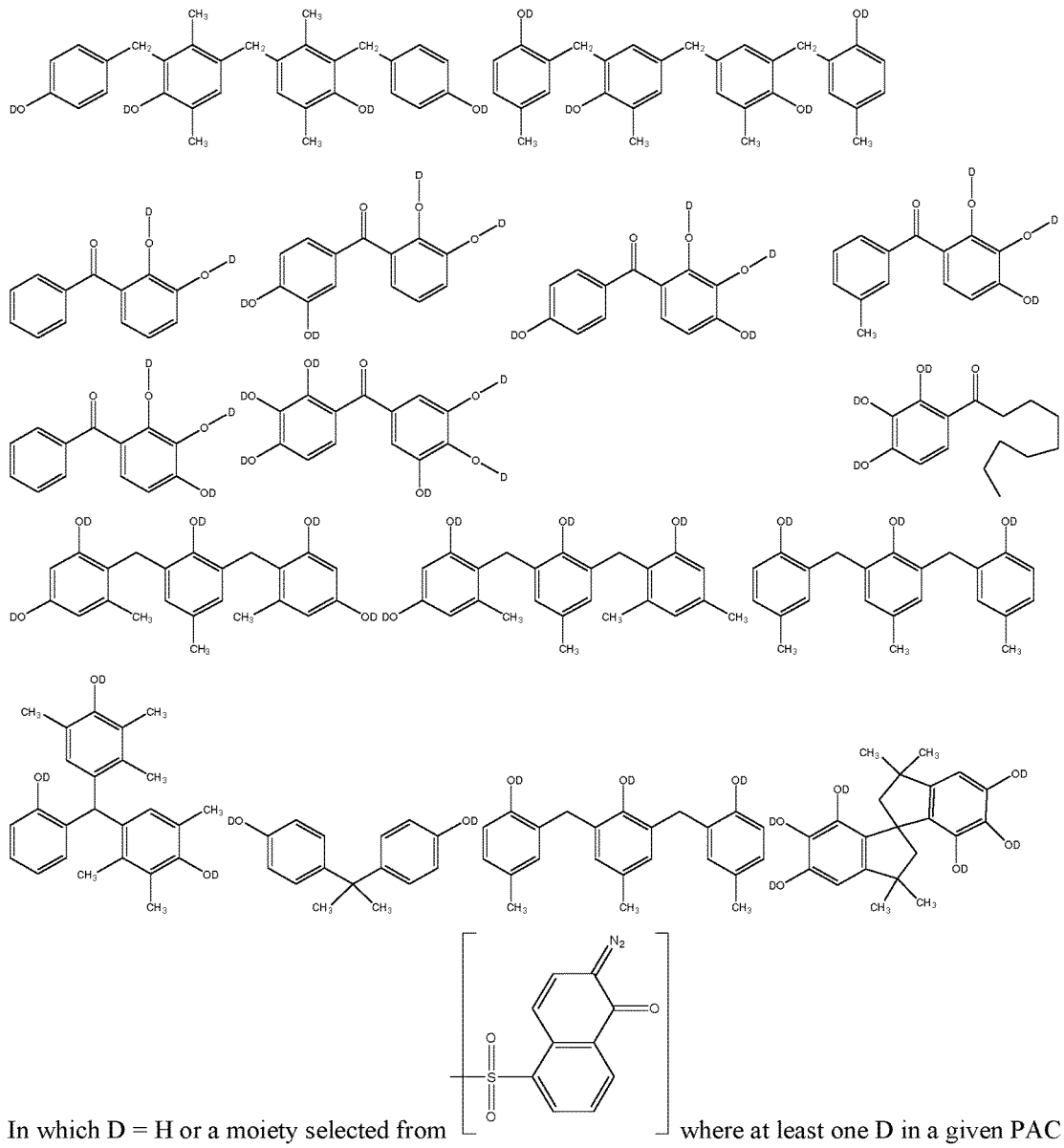
FIG. 1 illustrates non-limiting examples of the types of DNQ-PAC's that may be used as a free PAC component or used to form a coupled PACb component.

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including," as well as other forms such as "includes" and "included," is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature references and similar materials defines a term in a manner that contradicts the definition of that term in this application, this application controls.

Herein, the term "linking point," when referring to any of the inventive polymers refers to a branching point to another polymer chain and/or a crosslinking point to another polymer chain, wherein the extent of branching and/or crosslinking is such that the resultant branched and/or crosslinked polymer still has a molecular weight sufficiently low so as to avoid reaching the gel point where the polymer would become insoluble in solvents such as spin-casting solvents.

Herein, unless otherwise indicated, alkyl refers to hydrocarbon groups which can be linear, branched (e.g., methyl, ethyl, propyl, isopropyl, tert-butyl and the like) or cyclic (e.g. cyclohexyl, cyclopropyl, cyclopentyl and the like) multicyclic (e.g., norbornyl, adamantly and the like). These alkyl moieties may be substituted or unsubstituted as described below. The term alkyl refers to such moieties with C-1 to C-20 carbons. It is understood that for structural reasons linear alkyls start with C-1, while branched alkyls and linear start with C-3 and multicyclic alkyls start with C-5. Moreover, it is further understood that moieties derived from alkyls described below such as alkyloxy, haloalkyloxy have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbons for a given type of alkyl group still apply.

Alkyloxy (a.k.a. Alkoxy) refers to an alkyl group on which is attached through an oxy (—O—) moiety (e.g., methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br, or I which is linked by one bond to an organic moiety.

Haloalkyl refers to a linear, cyclic or branched saturated alkyl group such as defined above in which at least one of the hydrogens has been replaced by a halide selected from the group of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g., trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g., trifluoromethyoxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range of carbon atoms which starts with C-1 such as for instance "C-1 to C-20 alkyl," or "C-1 to C-20 fluoroalkyl," as non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term alkylene refers to hydrocarbon groups which can be a linear, branched or cyclic which has two or more attachment points (e.g., of two attachment points: methylene, ethylene, 1,2-isopropylene, a 1,4-cyclohexylene and the like; of three attachment points 1,1,1-substituted methane, 1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

The term mono and oligomeric alkyleneoxyalkylene encompasses both simple alkyleneoxyalkylene moiety such as ethyleneoxyethylene (—CH$_2$—CH$_2$—O—CH$_2$—CH$_2$—), propyleneoxypropylene (—CH$_2$—CH$_2$—CH$_2$—O—CH$_2$—CH$_2$—CH$_2$—), and the like, and also oligomeric materials such as tri(ethyleneoxyethylene) (—CH$_2$—CH$_2$—O—CH$_2$—CH$_2$—O—CH$_2$—CH$_2$—), tri(propyleneoxypropylen), (—CH$_2$—CH$_2$—CH$_2$—O—CH$_2$—CH$_2$—CH$_2$—O—CH$_2$—CH$_2$—CH$_2$—), and the like.

Herein the term "Aryl" or "aromatic groups" refers to such groups which contain 6 to 24 carbon atoms including phenyl, tolyl, xylyl, naphthyl, anthracyl, biphenyls, bisphenyls, tris-phenyls and the like. These aryl groups may further be substituted with any of the appropriate substituents e.g. alkyl, alkoxy, acyl or aryl groups mentioned hereinabove.

The term "Novolak" if used herein without any other modifier of structure, refers to Novolak resins which are soluble in aqueous bases such as tetramethylammonium hydroxide and the like.

Herein the term "arylene" refers to a aromatic hydrocarbon moiety which has two or more attachment points (e.g., 2-5), this moiety may be a single benzene moiety (e.g., two attachment points 1,4-phenylene, 1,3-phenylene and 1,2-phenylene; three attachment points 1,2,4-substituted benzene, 1,3,5-substituted benzene and the like), a polycyclic aromatic moiety with two attachment points such derived from naphthalene, anthracene, pyrene and the like, or a multiple benzene rings in a chain which have two attachment point (e.g., biphenylene). In those instances where the aromatic moiety is a fused aromatic ring, these may be called fused ring arylenes, and more specifically named, for instance, naphthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5 to 10 carbon atoms.

The photosensitive composition disclosed herein specifically exclude a PAG component, wherein, the term "PAG," refers to a photo acid generator, which is any compound that can photo-generate a strong acids having a pK$_a$ of about 2 and lower, under deep UV or UV irradiation such as 200-300 nm, i-line, h-line, g-line and/or broadband irradiation. Examples of such strong acid photogenerated acid are arylsulfonic acids, alkylsulfonic acids, perfluoroalkylsulfonic acid, HCl, HBr, HAsF$_6$, tris(perfluoroalkylsulfonyl)carbides, bis(perfluoroalkylsulfonyl)amides, tetrafluoroalkylborate, and the like. Non-limiting, examples PAG additives which are excluded from the composition described herein are PAG materials, such as onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, sulfonic acid ester derivatives, imidoyl sulfonate derivatives, halogenated triazine compounds, and diazonaphthoquinone sulfonate phenolic esters which photogenerate a sulfonic acid such as 3-diazo-3,4-dihydro-4-oxo-1-Naphthalene-sulfonates of phenolic compounds which incorporate a DNQ moiety of structure (VIIIb).

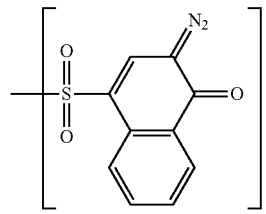

(VIIIb)

Herein, the term PAC, refers to a 2,1,5-diazonaphthoquinonesulfonate of a phenolic compound wherein a 2,1,5-diazonaphthoquinonesulfonate moiety (VIIIa) is attached to a phenolic compound through a sulfonate ester (—SO$_2$—O—) bond. The phenolic compound forming this sulfonate ester bond may be with a phenolic compound substituted with more than one phenolic OH moiety, and consequently, the PAC may be such a phenolic compound wherein more than one of the phenol OH form this sulfonate bond. Non-limiting examples of these free PAC materials are described in "DIAZONAPTHOQUINONE-BASED RESISTS, VOLUME TT 11" Ralph Dammel, SPIE Optical Engineering Press (1993) at Chapters 2 and 3.

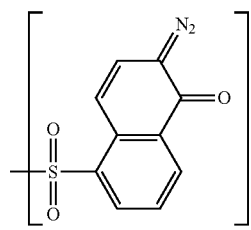

These 2,1,5-diazonaphthoquinonesulfonate comprising materials (2,1,5-DNQ material) are diazonapthoquinonesulfonate materials when UV exposed, do not form sulfonic acid, such as illustrated below only forming photochemically an indene carboxylic acid (excerpted from "DIAZONAPTHOQUINONE-BASED RESISTS, VOLUME TT 11" Ralph Dammel, SPIE Optical Engineering Press (1993) at 20):

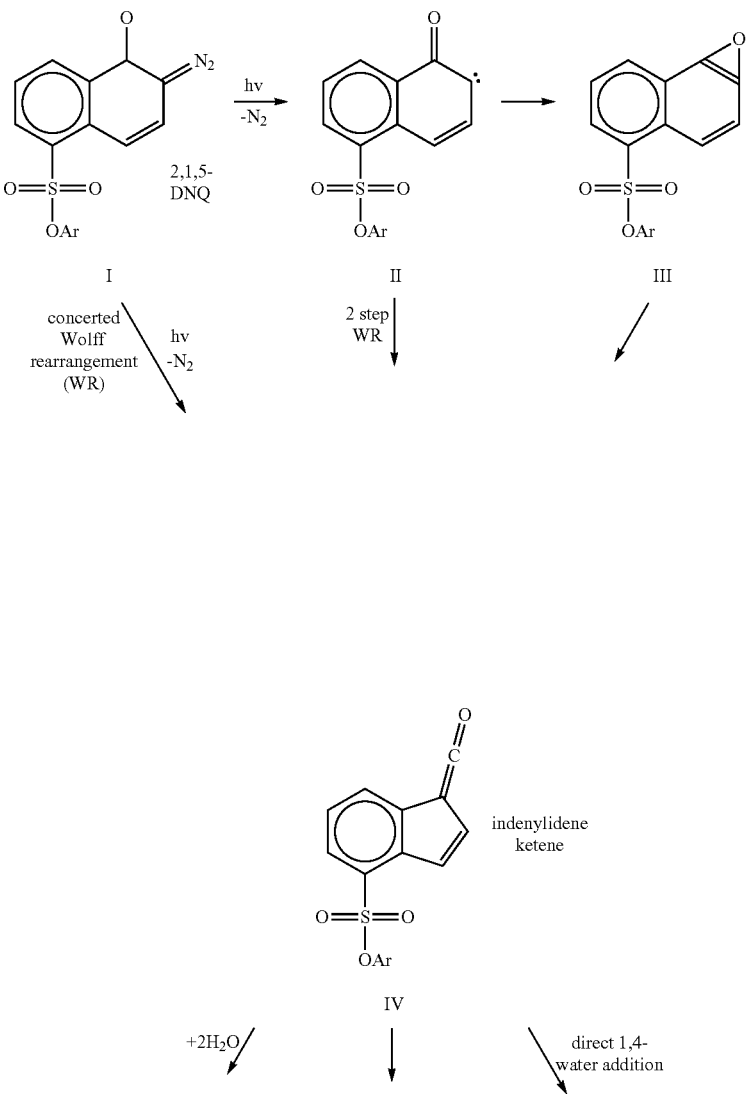

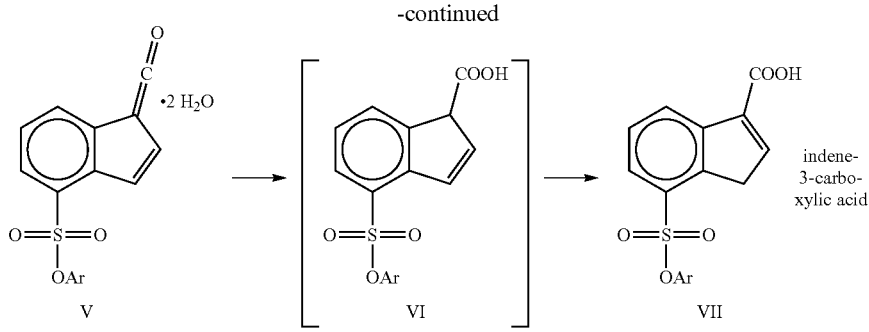

Herein the term "arene," encompasses aromatic hydrocarbon moieties comprising 1 ring or 2 to 8 carbon based aromatic rings fused together.

The term "heteroarene" refers to an arene which contains 1 or more trivalent or divalent heteroatoms respectively in such a way as to retain its aromaticity. Examples of such hetero atoms are N, O, P, and S. As non-limiting examples, such heteroarenes may contain from 1 to 3 such hetero atoms.

Unless otherwise indicated in the text, the term "substituted" when referring to an aryl, alkyl, alkyloxy, fluoroalkyl, fluoroalkyloxy, fused aromatic ring, arene, heteroarene refers to one of these moieties which also contain with one or more substituents, selected from the group of unsubstituted alkyl, substituted alkyl, unsubstituted aryl, alkyloxyaryl (alkyl-O-aryl-), dialkyloxyaryl ((alkyl-O—)$_2$-aryl), haloaryl, alkyloxy, alkylaryl, haloalkyl, halide, hydroxyl, cyano, nitro, acetyl, alkylcarbonyl, formyl, ethenyl (CH$_2$=CH—), phenylethenyl (Ph-CH=CH—), arylethenyl (Aryl-CH=CH), and substituents comprising ethenylenearylene moieties (e.g., Ar(—CH=CH—Ar—)$_z$ where z is 1-3. Specific, non-limiting examples of substituted aryl and substituted aryl ethenyl substituent are as follows where "∿∿∿" represents the point of attachment:

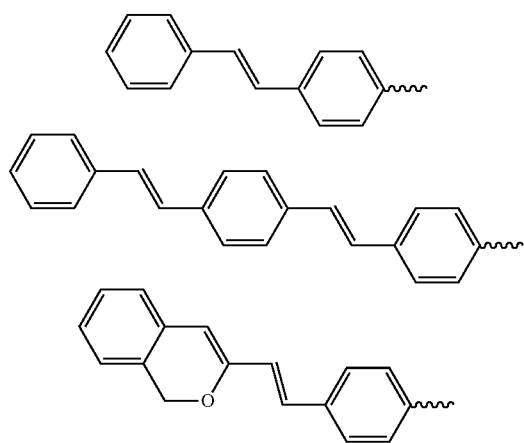

Otherwise, substituted aryl, and substituted ethenyls, where the substituent is selected from any of the above substituents. Similarly, the term "unsubstituted" refers to these same moieties, wherein no substituents apart from hydrogen is present.

The terms "acid quencher" and/or "quencher system," refers to one or more basic components, such as amines, which in a resist formulation could act to capture an indene carboxylic photogenerated by a 2,1,5-diazonaphthoquinonesulfonate PAC component, during exposure to UV radiation (e.g. i-line or broadband radiation).

The term "solid components," refers to components in a photoresist formulation which are not the solvent. Such components may be solids or liquids.

The term "phenolic resin component" includes all phenolic containing polymeric materials, including Novolak polymers/resins and hydroxystyrene polymers/resins.

The phrase "a di-functional linking acetal moiety protecting a hydroxy moiety on each of two different Novolak polymer chains" and "a di-functional linking acetal moiety protecting a hydroxy moiety on each of two different hydroxystyrene polymer chains" are each meant to describe a di-acetal junction between two Novolak polymer backbones or two hydroxystyrene polymer backbones that occurs when a difunctional acetal moiety is formed protecting two different phenolic hydroxy Novolak repeat units or hydroxystyrene repeat units. The following non-limiting example, which shows a Novolak polymer, illustrates an organic di-functional spacer moiety "Spacer" that links the two acetals moieties which comprise the di-functional acetal moiety linking the two Novolak polymer chains. In this illustration, the moieties ∿∿∿ A and ∿∿∿ B designate attachment of this di-functional acetal moiety which links and protects a Novolak phenolic hydroxy moiety to a first Novolak polymer chain A and to a second Novolak polymer chain B:

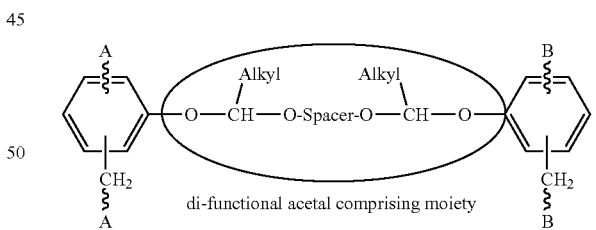

The phrase "an acetal moiety functionalized with a PAC moiety" is meant to describe a mono acetal moiety which protects a single hydroxy moiety on the phenolic Novolak or hydroxystyrene repeat unit. The following non-limiting example, which shows a Novolak polymer, illustrates where a linking moiety such as a direct valence bond, or an organic spacer group, links the acetal moiety to a photoactive 2,1,5-diazonaphthoquinonesulfonate compound. In this example, the moieties ∿∿∿ A designates the Novolak polymer chain which contains the repeat unit that includes the phenolic hydroxy moiety which is protected by the acetal that further includes a moiety functionalized with a PAC moiety.

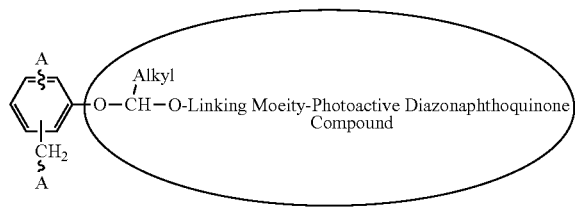

an acetal, comprising a moiety functionalized with a PAC moiety

Resist Compositions

The resist compositions disclosed and claimed herein are chemically amplified resist compositions that include:

(A) a phenolic resin component, wherein the phenolic resin component is a Novolak derivative comprising:
  (i) Novolak repeat units with free phenolic hydroxy moieties and
  (ii) Novolak repeat units having phenolic hydroxy moieties protected with an acid cleavable acetal moiety, wherein the acid cleavable acetal moiety is one or more of:
    (a) a monofunctional alkyl acetal moiety,
    (b) an acetal moiety functionalized with a PAC moiety (referred herein as "PACb"),
    (c) a di-functional linking acetal moiety protecting a hydroxy moiety on each of two different Novolak polymer chains;
(B) a photoactive non-sulfonic acid generating photoactive diazonaphthoquinone (PAC) component comprising 2,1,5 diazonaphthoquinonesulfonate or a derivative thereof,
  wherein the PAC component is one or more of:
    (i) the acetal moiety functionalized with a PAC moiety, and
    (ii) a free PAC component;
(C) a solvent component; and
(D) one or more optional components,
where the resist compositions do not include an added PAG component.

In one embodiment, the resist compositions comprise the forgoing ingredients.

In another embodiment, the resist compositions consist essentially of the forgoing ingredients.

In another embodiment, the resist compositions consist of ingredients (A), (B) and (C).

Notably, the resist compositions disclosed and claimed herein do not require or include a photo acid generator (PAG) in order to deprotect the phenolic resin and also do not require a post-exposure bake (PEB) step when used in certain lithographic processes (e.g., thinner film applications)

The Novolak-derived resin includes one or both of (i) Novolak repeat units with free phenolic hydroxy moieties and (ii) Novolak repeat units having phenolic hydroxy moieties protected with an acid cleavable acetal moiety.

The acid cleavable acetal moiety is one or more of (i) a monofunctional alkyl acetal moiety; (ii) an acetal moiety functionalized with a PAC moiety (i.e., a PACb), (iii) a di-functional linking acetal moiety protecting a hydroxy moiety on each of two different Novolak polymer chains and (iv) a mixture of any of these three types of acid cleavable acetal moieties (i.e., the acid cleavable acetal moiety is one or more of moieties (i), (ii) and (iii)).

The DNQ-PAC component is one or more of (i) the acetal moiety functionalized with a PAC moiety or a compound including a PACb moiety and (ii) a free PAC component (i.e., a PAC or compound including a PAC moiety) that is not a component of the acetal moiety. Thus, in one embodiment, the PAC is the acetal moiety protecting the phenolic resin where the acetal moiety is functionalized with a PAC moiety or a compound including a PAC moiety. In another moiety, the PAC is a free PAC and not a component of the acetal moiety. In yet another embodiment, the PAC includes both (i) the acetal moiety protecting the phenolic resin where the acetal moiety is functionalized with a PAC moiety or a compound including a PAC moiety and (ii) a free PAC that is not a component of the acetal moiety.

In different aspects of the disclosed and claimed resists, the PAC component may be either be used as a free PAC compound and/or may be a PACb moiety attached (grafted) to a phenolic moiety in a Novolak repeat unit through an acetal protecting group. Whether as a free PAC and/or a PACb, the PAC component is a substituted or unsubstituted 2,1,5-DNQ material or a compound onto which a substituted or unsubstituted 2,1,5-DNQ material is appended and that do not produce sulfonic acid upon UV exposure. FIG. 1 illustrates non-limiting examples of different DNQ-PAC's which may be used as a free PAC component or alternatively be attached to the phenolic resin component as a PACb moiety. In FIG. 1, the moiety D is —H or VIIIa.

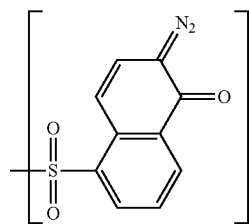

(VIIIa)

where in each compound depicted in this FIG. 1 at least one D is a moiety of structure VIM. The attachment of the DNQ-PAC to a phenolic resin component through an acetal moiety may be either through an ether bond, an acetal bond or a carbon-carbon bond.

In an embodiment of the disclosed subject matter the PACb moiety attached to the phenolic resin component may be derived from a DNQ-PAC material which originally has at least one free phenol functional group, which becomes the attachment point for an acetal linking group to a phenolic repeat unit of the phenolic resin component. As non-limiting examples, the DNQ-PAC's depicted in FIG. 1. may be used, provided that at least one D moiety is H and at least one D moiety is a moiety selected from structures A or B. In one non-limiting example a PACb attached to the polymer may be achieved through the reaction of a free phenol on these DNQ-PAG to form an ether or acetal link with an acetal comprising linking moiety with the polymer. Alternatively, the acetal comprising linkage of a DNQ-PAC in FIG. 1 to a phenolic resin component may be achieved through a carbon-carbon bond with an aromatic ring in these DNQ-PAC.

In another embodiment, the one or more optional ingredients can, for example, be an acid quencher.

I. Phenolic Resin Component

The phenolic resin component is a Novolak-derived resin that includes at least two repeat units selected from structures (I), (II), (III), (IV), (V) and (VI), preferably a repeat unit of structure (I) and at least one repeat unit selected from structures (II), (III), (IV), (V) and (VI):

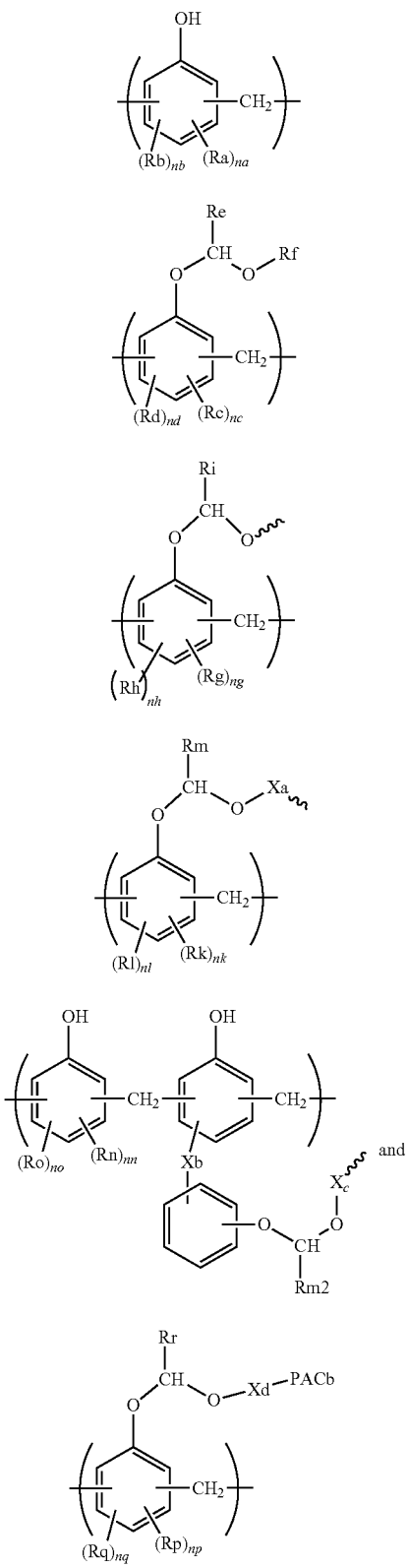

wherein
(i) Ra, Rc, Rg, Rk, Rn and Rp are each independently a C-1 to C-4 alkyl, (ii) Rb, Rd, Rh, Rl, Ro, and Rq are each independently a —X-Phenol where X is —O—, —C(CH$_3$)$_2$—, —(C=O)— or —SO$_2$—, (iii) na, nc, ng, nk, nn and np are each independently 0 to 3, the sum of na and nb, the sum of nc and nd, the sum of ng and nh, the sum of nk and nl, the sum nn of no, the sum of np and nq and each respectively does not exceed 3, (vi) Re, Rf, Ri, Rm, Rm2, and Rr are each independently selected from a C-1 to C-4 alkyl, (vii) the repeat units having structures (III) is attached to either the repeat unit of structure (IV) or the repeat unit of structure (V) through the positions designated by "〰〰" thereby forming a di-functional acetal moiety providing a linking point in the phenolic resin component between two different polymer chains, (viii) Xa is an alkylene, an -alkyleneoxyalkylene- moiety or an -alkylene(-O-alkylene)$_{x'}$- moiety where x' is 2 to 6

(viv) Xb is —O—, —C(CH$_3$)$_2$—, —(C=O)— or —SO$_2$, (vv) Xc is an alkylene, an -alkyleneoxyalkylene- moiety or an -alkylene(-O-alkylene)$_{x'}$- moiety where x' is 2 to 6

(vvi) the PACb moiety is a PAC component in the repeat unit having structure (VI) attached through a linking group Xd, wherein Xd is selected from the group consisting of:

a) a direct valence bond, b) an alkylene moiety, c) an alkyleneoxy moiety where an alkylene end is attached to an acetal oxygen moiety of the repeat unit of structure (VI) and an oxy end of the alkyleneoxy moiety is attached to the PACb moiety, and d) a moiety comprising an acetal selected from the group consisting of i) an alkyleneacetal moiety (-alkylene-O—CH(CH$_3$)—O—), ii) an alkyleneoxyalkyleneacetal moiety (-alkylene-O-alkylene-O—CH(CH$_3$)—O—), and iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

These resins include free hydroxy groups as well as protected hydroxy groups. The protected hydroxy groups are protected by acid labile monofunctional or substituted acetal groups that can also provide, in different embodiments, crosslinking between different polymer chains of the phenolic resin. In some embodiments, the acetal groups can also include some or all of the PAC component (i.e., a PACb).

Described below are various exemplary phenolic resin components that includes different combinations of repeat unit structures (I), (II), (III), (IV), (V) and (VI). Those skilled in the art will recognize, however, that other repeat units (including non-Novolak repeat units) can also be included as part of the phenolic resin without deviating from the spirit of the disclosed and claimed subject matter.

Monofunctional Alkyl Acetal Protected Novolak Resins

In one embodiment, the phenolic resin component includes repeat units having structures (I), and (II) (i.e., a repeat unit with monofunctional alkyl acetal):

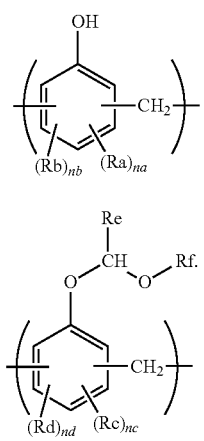 (I)

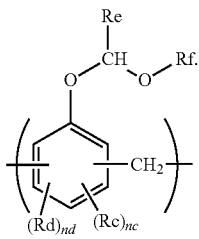 (II)

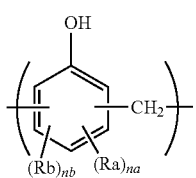 (I)

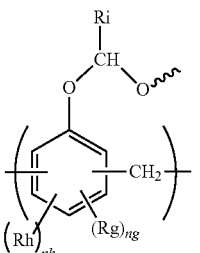 (III)

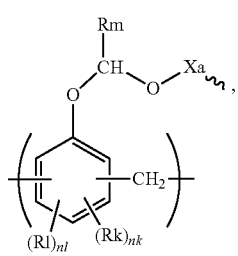 (IV)

In such an embodiment, for example, (i) Ra and Rc are each independently a C-1 to C-4 alkyl, (ii) Rb and Rd are each independently a —X-Phenol where X is —O—, —C(CH$_3$)$_2$—, —(C=O)— or —SO$_2$—, (iii) na and nc are each independently 0 to 3, (iv) nb and nd are each independently 0 or 1, (v) the sum of na and nb (i.e., na+nb) and the sum of nc and nd (i.e., nc+nd) each respectively does not exceed 3 and (vi) Re and Rf are each independently selected from a C-1 to C-4 alkyl. In a further aspect, the 2,1,5-DNQ-PAC component includes a free 2,1,5-DNQ-PAC which is not attached phenolic resin component.

In another aspect of the above embodiment the repeat unit having structure (I) is present from about 60 mole % to about 98 mole % and the repeat unit having structure (II) is present up to about 40 mole %. mole % of repeat units in the context of this invention are given based on the total number of moles of all repeat units in the respective polymer.

In another aspect of this embodiment, the repeat unit having structure (I) is present from about 70 mole % to about 98 mole %.

In another aspect of the above embodiment, the repeat unit having structure (I) is present from about 70 mole % to about 80 mole %.

In another aspect of the above embodiment, the repeat unit having structure (II) is present up to about 20 mole %.

In another aspect of this embodiment, nb and nd both equal 0.

In another aspect of this embodiment, na and nc both equal 1.

In another aspect of this embodiment, Re is methyl.

In another aspect of this embodiment, Rf is ethyl.

In another aspect of this embodiment, Ra is methyl.

In another aspect of this embodiment, Rc is ethyl.

Figure 2:
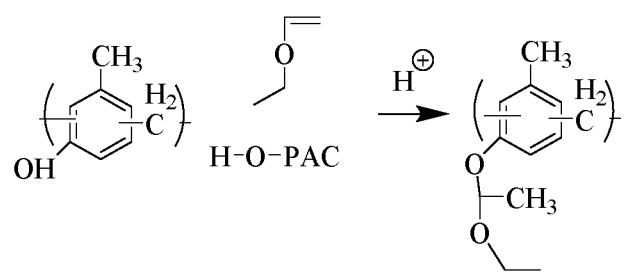
FIG. 2 illustrates an exemplary procedure for preparing an acetal protected Novolak by reacting a Novolak with an alkyl vinyl ether (e.g., ethyl vinyl ether) in the presence of an acid catalyst.

As a non-limiting example, FIG. 2 illustrates a procedure for preparing an acetal protected Novolak by reacting a Novolak with an alkyl vinyl ether (e.g., ethyl vinyl ether) in the presence of an acid catalyst.

Novolak Resins Linked by Di-Functional Acetal Comprising Moieties

In another embodiment, the phenolic resin component includes repeat units having structures (I), (III) and (IV):

where the repeat units having structures (III) and (IV) are attached together through the positions designated by " ~~~ " thereby forming a di-functional acetal moiety providing a linking point in the phenolic resin component between two different polymer chains.

In such an embodiment, for example, (i) Ra, Rg and Rk are each independently a C-1 to C-4 alkyl, (ii) Rb, Rh, and Rl are each independently a —X-Phenol where X is —O—, —C(CH$_3$)$_2$—, —(C=O)— or —SO$_2$—, (iii) na, ng and nk are each independently are 0 to 3, (iv) nb, nh and nl are each independently 0 or 1, (v) the sum of na and nb (i.e., na+nb), the sum of ng and nh (i.e., ng+nh) and the sum of nk and nl (i.e., nk+nl) each respectively does not exceed 3, (vi) Ri and Rm are each independently selected from a C-1 to C-4 alkyl, (vii) Xa is an alkylene, an -alkyleneoxyalkylene- moiety or an -alkylene(-O-alkylene)$_{x'}$- moiety where x' is 2 to 6. In such an embodiment, the 2,1,5-DNQ PAC component includes a free PAC, but can also include a PACb as part of an additional repeat unit (VI), or a mixtures of these two types of 215-DNQ PAC components.

In another aspect of this embodiment, the repeat unit having structure (I) is present from about 60 mole % to about 98 mole %. In a further aspect, the repeat unit having structure (I) is present from about 70 mole % to about 98 mole %. In a further aspect, the repeat unit having structure (I) is present from about 70 mole % to about 80 mole %.

In another aspect of this embodiment, the linking point between two polymer chains of the phenolic resin component that is formed by the repeat units of structure (III) and structure (IV) is present up to about 25 mole % of the phenolic resin component's repeat units. In a further aspect, the repeat units of structure (III) and structure (IV) is present up to about 10 mole % of the phenolic resin component's repeat units.

In another aspect of this embodiment, nb, nh and nl are each 0.

In another aspect of this embodiment, na, ng and nk are each 1.

In another aspect of this embodiment, Ra and Rg and Rk are each methyl.

In another aspect of this embodiment, Ri is methyl.

In another aspect of this embodiment, Rm is methyl.

In another aspect of this embodiment, Xa is an alkylene moiety.

In another aspect of this embodiment, Xa is an -alkyleneoxyalkylene- moiety, or an -alkylene(-O-alkylene)$_{x'}$- moiety where x' is 2 to 6.

In another aspect of this embodiment, Xa is an alkylenexoxyalkylene moiety. In a further aspect, the alkylene is selected from ethylene, propylene and butylene.

In another aspect of this embodiment, Xa is an -alkylene (-O-alkylene)$_{x'}$- moiety where x' is 2 to 6. In a further aspect, the alkylene is selected from ethylene, propylene and butylene.

In another aspect of this embodiment, Xa includes an alkylene moiety of structure (VII):

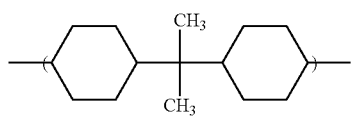
(VII)

or a moiety of structure (VIIa):

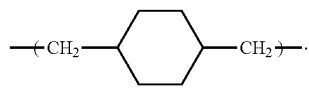
(VIIa)

In one aspect, Xa includes an alkylene moiety of structure (VIIa)

In another aspect of this embodiment, Xa is an -alkyleneoxyalkylene- moiety of structure (VIIb):

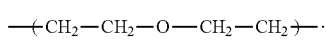
(VIIb)

Figure 3:
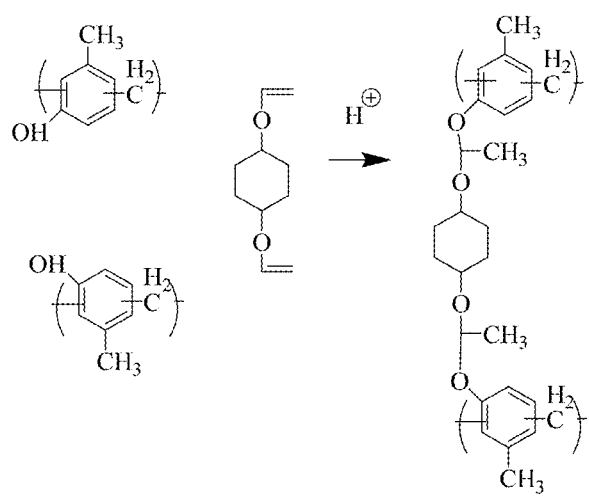
FIG. 3 illustrates an exemplary procedure for preparing a phenolic resin including an Xa alkylene linking group where the alkylene linking group is introduced between two polymer chains thereby linking them by way of the reaction of a Novolak phenol moiety with a divinyl ether (e.g., divinyl ether of 1,4-hexanediol) in the presence of acid.

As a non-limiting example, FIG. 3 illustrates a procedure for preparing a phenolic resin including an Xa alkylene linking group where the alkylene linking group is introduced between two polymer chains thereby linking them by way of the reaction of a Novolak phenol moiety with a divinyl ether (e.g., divinyl ether of 1,4-hexanediol) in the presence of acid.

Figure 4:
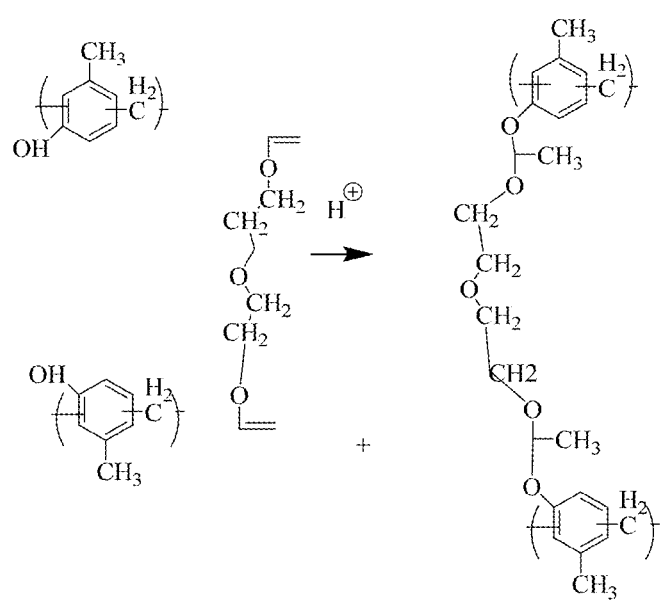
FIG. 4 illustrates an exemplary procedure for preparing a phenolic resin including an Xa alkylene-O-alkylene linking group where the alkylene-O-alkylene linking group is introduced between two polymer chains thereby linking them by way of the reaction of a Novolak phenol moiety with a divinyl ether (e.g., divinyl ether of diethylene glycol) in the presence of acid.

As a non-limiting example, FIG. 4 illustrates a procedure for preparing a phenolic resin including an Xa alkylene-O-alkylene linking group where the alkylene-O-alkylene linking group is introduced between two polymer chains thereby linking them by way of the reaction of a Novolak phenol moiety with a divinyl ether (e.g., divinyl ether of diethylene glycol) in the presence of acid.

Figure 5:
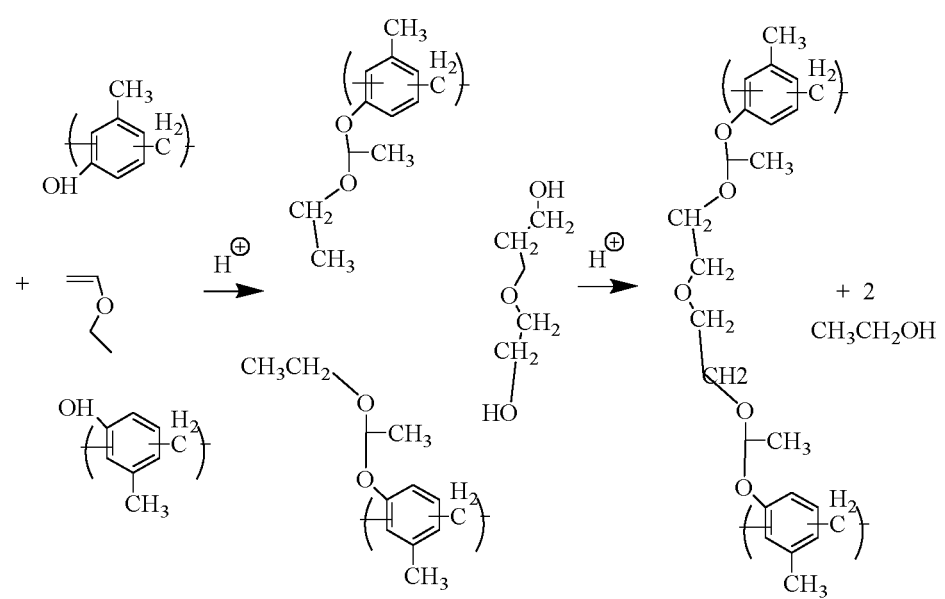
FIG. 5 illustrates an exemplary procedure for preparing a phenolic resin including an Xa alkylene-O-alkylene linking group where the alkylene-O-alkylene linking group is introduced between two polymer chains thereby linking them by way of the reaction of a Novolak phenol moiety with a vinyl ether (e.g., ethyl vinyl ether), a glycol (e.g., diethylene glycol) in the presence of acid.

As a non-limiting example, FIG. 5 illustrates a procedure for preparing a phenolic resin including an Xa alkylene-O-alkylene linking group where the alkylene-O-alkylene linking group is introduced between two polymer chains thereby linking them by way of the reaction of a Novolak phenol moiety with a vinyl ether (e.g., ethyl vinyl ether), a glycol (e.g., diethylene glycol) in the presence of acid.

In another embodiment, the phenolic resin component includes repeat units having structures (I), (III) and (V),

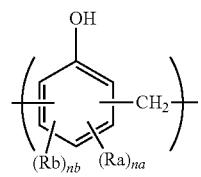
(I)

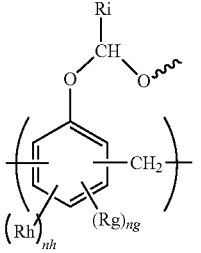
(III)

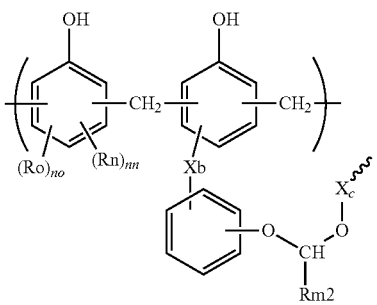
(V)

where the repeat units having structures (III) and (V) are attached together through the positions designated by " ﹏﹏ " thereby forming a di-functional acetal moiety providing a linking point in the phenolic resin component between two different polymer chains.

In such an embodiment, for example, (i) Ra, Rg and Rn are each independently a C-1 to C-4 alkyl, (ii) Rb, Rh and Ro are each independently a —X-Phenol where X is —O—, —C(CH$_3$)$_2$—, —(C=O)— or —SO$_2$—, (iii) na, ng, and nn are each independently 0 to 3, (iv) nb, nh and no are each independently 0 or 1, (v) the sum of na and nb (i.e., na+nb), the sum of ng and nh (i.e., ng+nh) and the sum of nn and no (i.e., nn+no) each respectively does not exceed 3, (vi) Ri and Rm2 are each independently selected from a C-1 to C-4 alkyl, (vii) Xb is —O—, —C(CH$_3$)$_2$—, —(C=O)— or —SO$_2$—, (viii) Xc is an alkylene, an -alkyleneoxyalkylene- moiety or an -alkylene(-O-alkylene)$_{x'}$- moiety where x' is 2 to 6. In such an embodiment, the DNQ-PAC component includes a free PAC, but can also include a PACb as part of an additional repeat unit (VI). or a mixture of these two types of 2,1,5-DNQ PAC components comprising structure (VIIIa).

In another aspect of this embodiment, the repeat unit having structure (I) is present from about 70 mole % to about 98 mole %. In a further aspect, the repeat unit having structure (I) is present from about 70 mole % to about 80 mole %.

In another aspect of this embodiment, the linking point between two polymer chains of the phenolic resin component that is formed by the repeat units of structure (III) and structure (V) is present up to about 25 mole % of the phenolic resin component's repeat units. In a further aspect, the repeat units of structure (III) and structure (V) are present up to about 10 mole % of the phenolic resin component's repeat units.

In another aspect of this embodiment, nb, nh and no are each 0.

In another aspect of this embodiment, na and ng are each 1 and nn is 0.

In another aspect of this embodiment, Ra and Rg are methyl.

In another aspect of this embodiment, Ri and Rm2 are both methyl.

In another aspect of this embodiment, Xb is —O—.

In another aspect of this embodiment, Xb is —C(CH$_3$)$_2$—.

In another aspect of this embodiment, Xb is —(C=O)—.

In another aspect of this embodiment, Xb is —SO$_2$—.

In another aspect of this embodiment, Xc is an alkylene moiety.

In another aspect of this embodiment, the phenolic resin component includes repeat units (I), (III) and (V) where Xc is an alkylenexoyalkylene moiety.

In another aspect of this embodiment, Xc is an -alkyleneoxyalkylene- moiety or an -alkylene(-O-alkylene)$_{x'}$- moiety where x' is 2 to 6. In a further aspect, Xc is an -alkylene(-O-alkylene)$_{x'}$- moiety where x' is 2 to 6. In a further aspect, the alkylene groups within these moieties are selected from ethylene, propylene and butylene.

In another aspect of this embodiment, Xc includes an alkylene moiety of structure (VII):

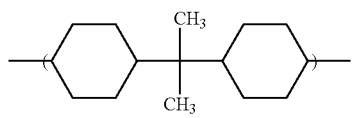

(VII)

or a moiety of structure (VIIa):

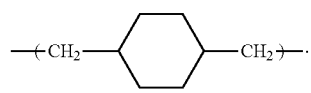

(VIIa)

In one aspect, Xc includes an alkylene moiety of structure (VII). In one aspect, Xc includes a moiety of structure (VIIa).

In another aspect of this embodiment, Xc is an -alkyleneoxyalkylene- moiety of structure (VIIb):

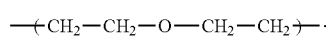

(VIIb)

For the above described phenolic resin components including repeat units of structure (I), (III) and (V), different embodiments of the linking moiety Xc may be introduced in a manner analogous to that described for the corresponding embodiment of Xa in Schemes 2 to 4.

Novolak Resins Functionalized with an Acetal Including a Linking Group Including a PAC Moiety (PACb)

In another embodiment, the phenolic resin component includes repeat units having structures (I), (II) and (VI):

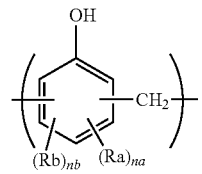

(I)

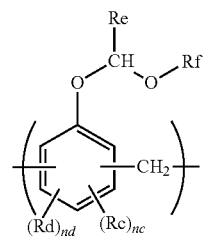

(II)

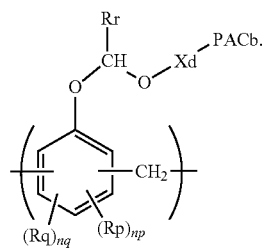

(VI)

In such an embodiment, for example, (i) Ra, Rc and Rp are each independently a C-1 to C-4 alkyl, (ii) Rb, Rd, and Rq are each independently a —X-Phenol where X is —O—, —C(CH$_3$)$_2$—, —(C=O)— or —SO$_2$—, (iii) na, nc and np are each independently 0 to 3, (iv) nb, nd and nq are each independently 0 or 1, (v) the sum of na and nb (i.e., na+nb), the sum of nc and nd (i.e., nc+nd) and the sum of np and nq (i.e., np+nq) each respectively does not exceed 3, (vi) Re, Rf and Rr are each independently selected from a C-1 to C-4 alkyl, (vii) the PACb moiety is a PAC component in the repeat unit having structure (VI) attached through a linking group Xd, wherein Xd is selected from the group consisting of:

a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
i) an alkyleneacetal moiety (-alkylene-O—CH(CH$_3$)—O—),
ii) an alkyleneoxyalkyleneacetal moiety (-alkylene-O-alkylene-O—CH(CH$_3$)—O—), and
iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

In another aspect of this embodiment, the PACb moiety is a substituted or unsubstituted 2,1,5-DNQ material or compound onto which a substituted or unsubstituted 2,1,5-DNQ material is appended and that do not produce sulfonic acid upon UV exposure, such as those illustrated in FIG. 1.

In another aspect of this embodiment, the repeat unit having structure (I) is present from about 60 mole % to about 98 mole %. In a further aspect, the repeat unit having structure (I) is present from about 70 mole % to about 98 mole %. In a further aspect, the repeat unit having structure (I) is present from about 70 mole % to about 80 mole %.

In another aspect of this embodiment, the repeat unit having structure (II) is present up to about 40 mole %. In a further aspect, the repeat unit of structure (II) is present up to about 20 mole %.

In another aspect of this embodiment, the repeat unit having structure (VI) does not exceed about 45 mole % of the repeat units in said phenolic resin component. In a further aspect, the repeat unit of structure (VI) is present up to about 10 mole %.

In another aspect of this embodiment, the repeat unit having structure (I) is present from about 60 mole % to about 98 mole %, the repeat unit having structure (II) is present from greater than 0 mole % to about 40 mole % and the repeat unit having structure (II) and repeat unit having structure (VI) do not exceed about 45 mole % of the repeat units in the phenolic resin component.

In another aspect of this embodiment, nb, nd and nq are each 0.

In another aspect of this embodiment, Ra, Rg, Rk and Rp are each methyl.

In another aspect of this embodiment, na, ng, nk and np are each 1.

In another aspect of this embodiment, Ri, Rm and Rr are each methyl.

In another aspect of this embodiment, Xd is an alkyleneacetal moiety (-alkylene-O—CH(CH$_3$)—O—).

In another aspect of this embodiment, Xd is an alkyleneacetal moiety (-alkylene-O—CH(CH$_3$)—O) that includes an the alkylene that is ethylene, propylene, a moiety having structure (VII):

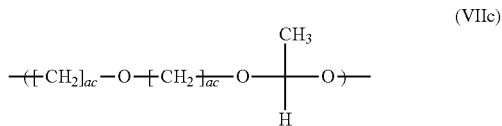

(VII)

or a moiety having structure (VIIa)

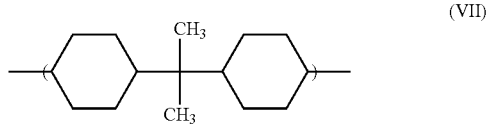

(VIIa)

In one aspect, Xd includes a moiety of structure (VII). In one aspect, Xd includes a moiety of structure (VIIa).

In another aspect of this embodiment, Xd is an alkyleneoxyalkyleneacetal moiety (-alkylene-O-alkylene-O—CH(CH$_3$)—O—). In a further aspect, the alkylene portions thereof are each independently a C-2 to C-8 alkylene moiety. In a further aspect, the alkylene portions thereof are each independently a C-2 to C-4 alkylene moiety. In a further aspect, the alkyleneoxyalkyleneacetal moiety (-alkylene-O-alkylene-O—CH(CH$_3$)—O—) includes a moiety having structure (VIIc):

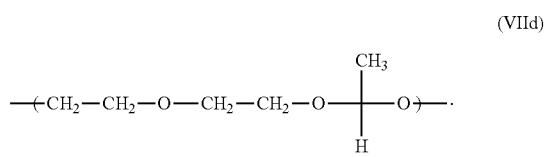

(VIIc)

where ac is an integer from 2 to 4. In still another further aspect, the alkyleneoxyalkyleneacetal moiety (-alkylene-O-alkylene-O—CH(CH$_3$)—O—), includes a moiety having structure (VIId):

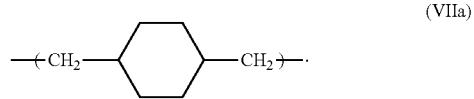

(VIId)

Figure 6:
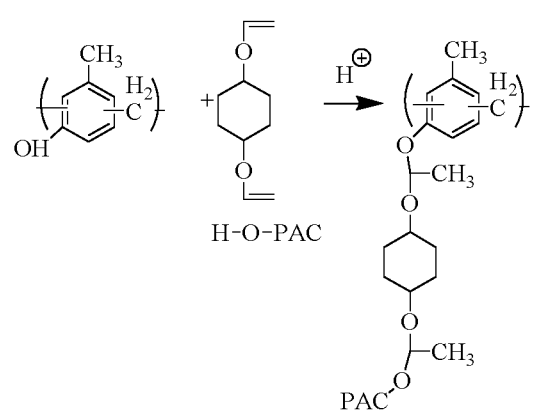
FIG. 6 illustrates an exemplary procedure for preparing phenolic resins (including repeat units of structure (I), (II) and (VI)) having an Xd alkyleneacetal moiety (alkylene-O—CH(CH$_3$)—O—) linking group and a PACb, where a Novolak resin is reacted in the presence of acid with a divinyl ether (e.g., divinyl ether of 1,4-cyclohexanediol or diethylene glycol) an a PAC compound having at least one free phenol functionality.
Figure 7:
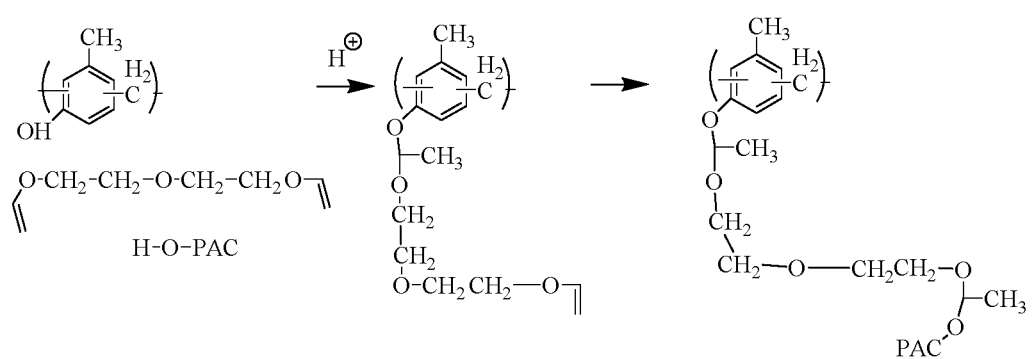
FIG. 7 illustrates another exemplary procedure for preparing phenolic resins (including repeat units of structure (I), (II) and (VI)) having an Xd alkyleneacetal moiety (alkylene-O—CH(CH$_3$)—O—) linking group and a PACb, where a Novolak resin is reacted in the presence of acid with a divinyl ether (e.g., divinyl ether of 1,4-cyclohexanediol or diethylene glycol) an a PAC compound having at least one free phenol functionality.

As non-limiting examples, FIG. 5 and FIG. 6 each illustrate procedures for preparing phenolic resins (including repeat units of structure (I), (II) and (VI)) having an Xd alkyleneacetal moiety (alkylene-O—CH(CH$_3$)—O—) linking group and a PACb, where a Novolak resin is reacted in the presence of acid with a divinyl ether (e.g., divinyl ether of 1,4-cyclohexanediol or diethylene glycol) an a PAC compound having at least one free phenol functionality.

Figure 8:
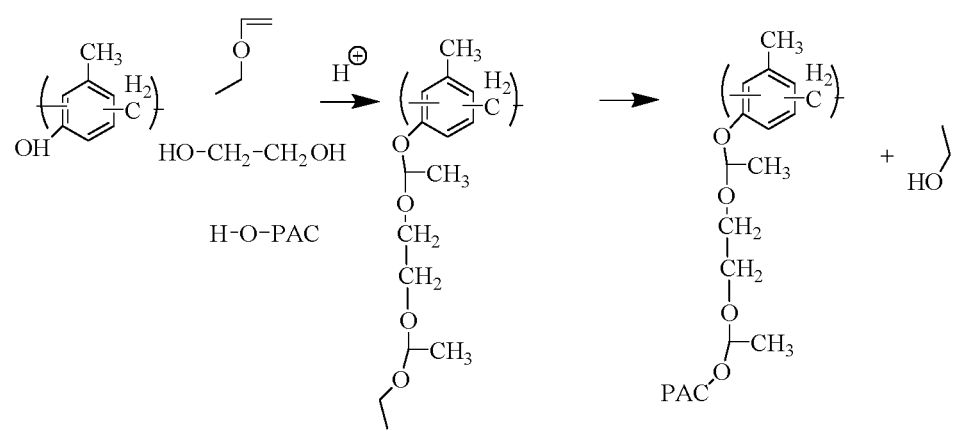
FIG. 8 illustrates an exemplary procedure in which a Novolak is reacted with a glycol compound (e.g., ethylene glycol or diethylene glycol), a mono functional vinyl ether (e.g., ethyl vinyl ether) and an acid.
Figure 9:
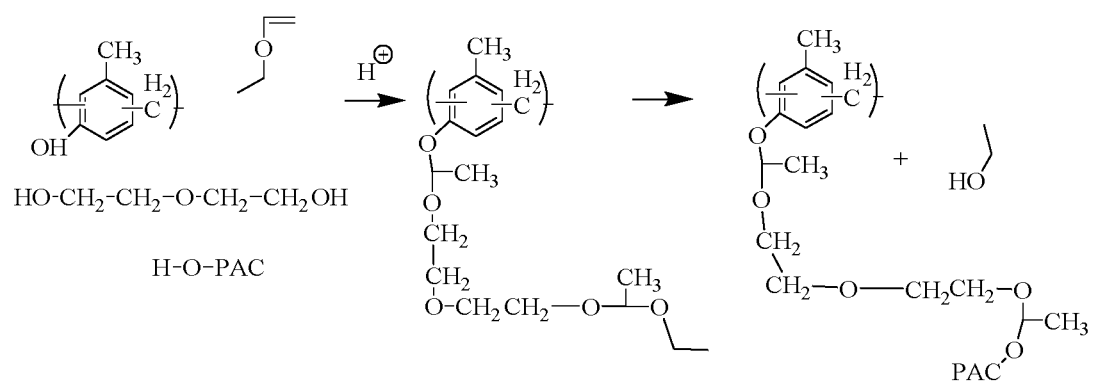
FIG. 9 illustrates another exemplary procedure in which a Novolak is reacted with a glycol compound (e.g., ethylene glycol or diethylene glycol), a mono functional vinyl ether (e.g., ethyl vinyl ether) and an acid.

As non-limiting examples, FIG. 8 and FIG. 9 each illustrate a procedure in which a Novolak is reacted with a glycol compound (e.g., ethylene glycol or diethylene glycol), a mono functional vinyl ether (e.g., ethyl vinyl ether) and an acid.

Figure 10:
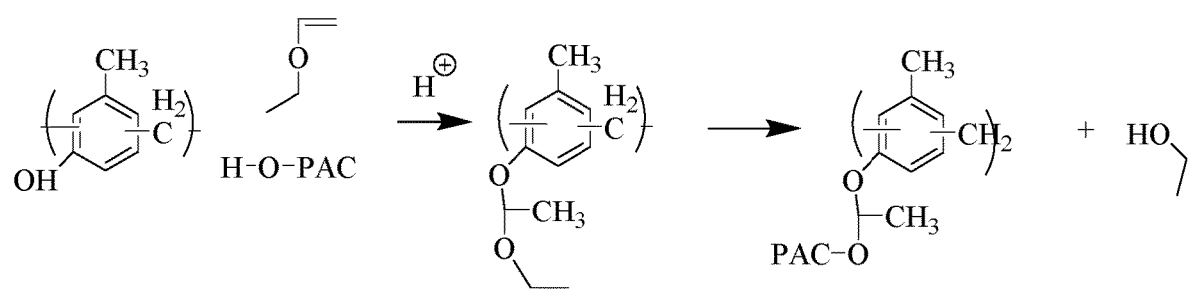
FIG. 10 illustrates an exemplary procedure in which the Xd linking moiety is a direct valence bond produced through a trans acetal reaction which occurs by reacting a Novolak resin in the presence of an acid with an alkyl vinyl ether (e.g., ethyl vinyl ether) and a PAC with has at least one free phenol functionality.

As non-limiting example, FIG. 10 illustrates a procedure in which the Xd linking moiety is a direct valence bond produced through a trans acetal reaction occurs by reacting a Novolak resin in the presence of an acid with an alkyl vinyl ether (e.g., ethyl vinyl ether) and a PAC with has at least one free phenol functionality.

Figure 11:
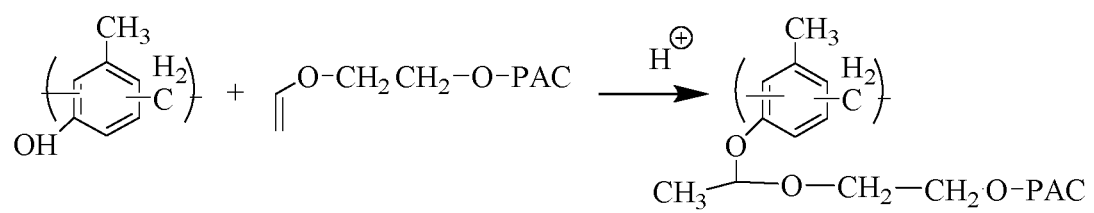
FIG. 11 illustrates an exemplary procedure by which an Xd alkyleneoxy linking acetal moiety can be formed by way of a reaction under acidic conditions between a vinyloxyalkyleneoxy PAC derivative and a Novolak polymer.

As non-limiting example, FIG. 11 illustrates a procedure by which an Xd alkyleneoxy linking acetal moiety can be formed by way of a reaction under acidic conditions between a vinyloxyalkyleneoxy PAC derivative and a Novolak polymer.

Figure 12:
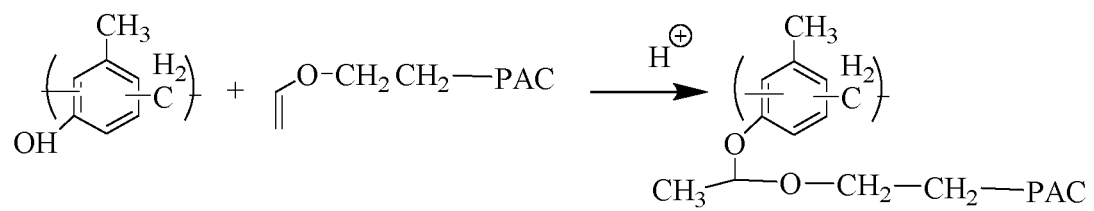
FIG. 12 illustrates an exemplary procedure by which an Xd alkylene linking acetal moiety can be formed by way of a reaction under acidic conditions between a vinyloxylalkylene PAC derivative and a Novolak polymer.

As non-limiting example, FIG. 12 illustrates a procedure by which an Xd alkylene linking acetal moiety can be formed by way of a reaction under acidic conditions between a vinyloxylalkylene PAC derivative and a Novolak polymer.

Novolak Resins with a Di-Functional Acetal Including (i) a Linking Group that Protects Two Repeat Units of a Novolak and (ii) an Acetal Group Including a PAC Moiety (PACb)

In other another aspect of the disclosed and claimed subject matter the phenolic resin component is one in which is an acetal linked Novolak resin is also functionalized with an acetal linking group attached to a PAC moiety (PACb). In these embodiments the acetal linked Novolak resin and its functionalization with an an acetal linking group attached to a PAC moiety (PACb) may be accomplished as has been previously described in Schemes 2 to 11.

In one embodiment, the phenolic resin component includes repeat units having structures (I), (III), (IV) and (VI):

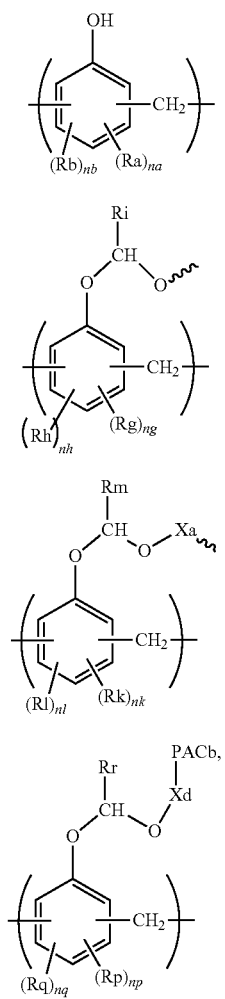

where the repeat units having structures (III) and (IV) are attached together through the positions designated by "〰" thereby forming a di-functional acetal moiety providing a linking point in the phenolic resin component between two different polymer chains.

In such an embodiment, for example, (i) Ra, Rg, Rk and Rp are each independently a C-1 to C-4 alkyl, (ii) Rb, Rh, Rl and Rq are each independently a —X-Phenol where X is —O—, —C(CH$_3$)$_2$—, —(C═O)— or —SO$_2$—, (iii) na, ng, nk and np are each independently 0 to 3, (iv) nb, nh, nl and nq are each independently 0 or 1, (v) the sum of na and nb (i.e., na+nb), the sum of nh and ng (i.e., nh+ng), the sum of nl and nk (i.e., nl+nk) and the sum of np and nq (i.e., np+nq) each respectively does not exceed 3, (vi) Ri, Rm, and Rr are each independently selected from a C-1 to C-4 alkyl, (vii) Xa is an alkylene, an -alkyleneoxyalkylene- moiety or an -alkylene(-O-alkylene)$_{x'}$- moiety where x' is 2 to 6 and (viii) the PACb moiety has the structure (VI) attached through a linking group Xd, wherein Xd is selected from the group consisting of:
  a) a direct valence bond,
  b) an alkylene moiety,
  c) an alkyleneoxy moiety where an alkylene end is attached to an acetal oxygen moiety of the repeat unit of structure (VI) and an oxy end of the alkyleneoxy moiety is attached to the PACb moiety, and
  d) a moiety comprising an acetal selected from the group consisting of
    i) an alkyleneacetal moiety (-alkylene-O—CH(CH$_3$)—O—),
    ii) an alkyleneoxyalkyleneacetal moiety (-alkylene-O-alkylene-O—CH(CH$_3$)—O—), and iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

In another aspect of this embodiment, the PACb moiety is a substituted or unsubstituted 2,1,5-DNQ material or compound onto which a substituted or unsubstituted 2,1,5-DNQ material is appended and that do not produce sulfonic acid upon UV exposure such as those illustrated in FIG. 1.

In another aspect of this embodiment, the repeat unit having structure (I) is present from about 60 mole % to about 98 mole %. In a further aspect, the repeat unit having structure (I) is present from about 70 mole % to about 98 mole %.

In another aspect of this embodiment, the linking point between two polymer chains of the phenolic resin components, formed by the repeat units of structure (III) and structure (IV), is present up to about 25 mole % of the phenolic resin component's repeat units. In a further aspect, the repeat units of structure (III) and structure (IV) is present up to about 10 mole % of the phenolic resin component's repeat units.

In another aspect of this embodiment, the repeat unit having structure (VI) is present up to about 20 mole %. In a further aspect, the repeat unit of structure (VI) is present up to about 10 mole %.

In another aspect of this embodiment, nb, nh, nl and nq are 0.

In another aspect of any of the above inventive embodiments, where the phenolic resin component includes repeat units, (I), (III), (IV) and (VI), Ra, Rg, Rk and Rp are each methyl.

In another aspect of this embodiment, na, ng, nk and np are 1.

In another aspect of this embodiment, Ri, Rm and Rr are methyl.

In another aspect of this embodiment, Xd is an alkyleneacetal moiety (-alkylene-O—CH(CH$_3$)—O—).

In another aspect of this embodiment, Xd is an alkyleneacetal moiety (-alkylene-O—CH(CH$_3$)—O) that includes an the alkylene that is ethylene, propylene, a moiety having structure (VII):

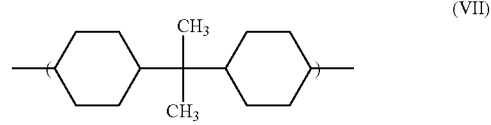

(VII)

or a moiety having structure (VIIa)

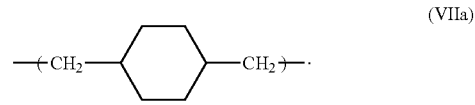

(VIIa)

In one aspect, Xd includes a moiety of structure (VII). In one aspect, Xd includes a moiety of structure (VIIa).

In another aspect of this embodiment, Xd is an alkyleneoxyalkyleneacetal moiety (-alkylene-O-alkylene-O—CH(CH$_3$)—O—). In a further aspect, the alkylene portions thereof are each independently a C-2 to C-8 alkylene moiety. In a further aspect, the alkylene portions thereof are each independently a C-2 to C-4 alkylene moiety. In a further aspect, the alkyleneoxyalkyleneacetal moiety (-alkylene-O-alkylene-O—CH(CH$_3$)—O—) includes a moiety having structure (VIIc):

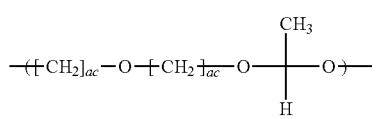
(VIIc)

where ac is an integer from 2 to 4. In still another further aspect, the alkyleneoxyalkyleneacetal moiety (-alkylene-O-alkylene-O—CH(CH$_3$)—O—) includes a moiety having structure (VIId):

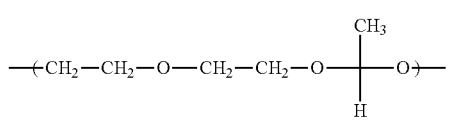
(VIId)

In another embodiment, the phenolic resin component includes repeat units of structures (I), (III), (V) and (VI):

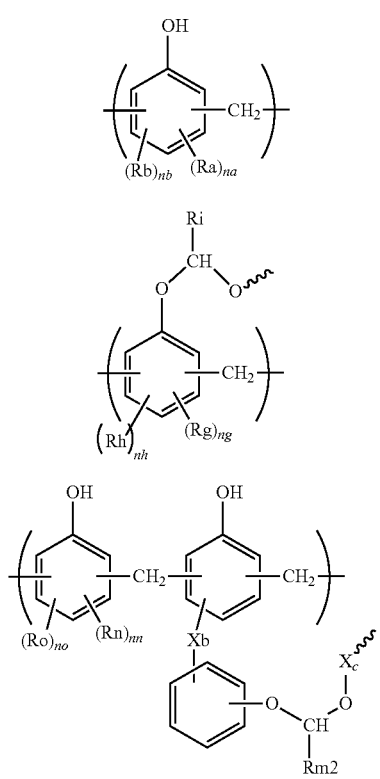

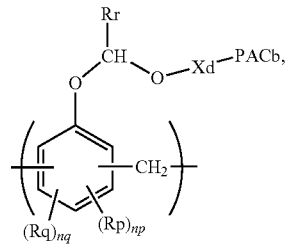
(VI)

where the repeat units having structures (III) and (V) are attached together through the positions designated by "∿∿∿∿" thereby forming a di-functional acetal providing a linking point in the phenolic resin component between two different polymer chains.

In such an embodiment, for example, (i) Ra, Rg, Rn and Rp are each independently a C-1 to C-4 alkyl, (ii) Rb, Rh, Ro and Rq are each independently a —X-Phenol where X is —O—, —C(CH$_3$)$_2$—, —(C=O)—, or —SO$_2$—, (iii) na, ng, nn and np are each independently 0 to 3, (iv) nb, nh, no and nq are each independently 0 or 1, (v) and the sum of na and nb (i.e., na+nb), the sum of nn and no (i.e., nn+no), the sum of nl and nk (i.e., nl+nk) and the sum of np and nq (i.e., np+nq) each respectively does not exceed 3, (vi) Ri and Rr are independently a C-1 to C-4 alkyl, (vii) Xb is —O—, —C(CH$_3$)$_2$—, —(C=O)— or —SO$_2$— and (viii) Xc is an -alkylene(-O-alkylene)$_{x'}$- moiety where x' is 2 to 6. In a further aspect, the alkylene moiety of Xa is selected from ethylene, propylene and butylene. In a further aspect, the alkylene moiety of Xa is ethylene (i.e., —CH$_2$—CH$_2$—O—CH$_2$CH$_2$—).

In a further aspect of this embodiment, the PACb moiety iv the structure (VI) attached through a linking group Xd is selected from the group consisting of:
a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
i) an alkyleneacetal moiety (-alkylene-O—CH(CH$_3$)—O—),
ii) an alkyleneoxyalkyleneacetal moiety (-alkylene-O-alkylene-O—CH(CH$_3$)—O—), and
iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

In another aspect of this embodiment, the PACb moiety is a substituted or unsubstituted 2,1,5-DNQ material or compound onto which a substituted or unsubstituted 2,1,5-DNQ material is appended and that do not produce sulfonic acid upon UV exposure such as those illustrated in FIG. 1.

In another aspect of this embodiment, the repeat unit having structure (I) is present from about 60 mole % to about 98 mole %. In a further aspect, the repeat unit having structure (I) is present from about 70 mole % to about 98 mole %. In a further aspect, the repeat unit having structure (I) is present from about 70 mole % to about 80 mole In another aspect of this embodiment, the repeat units of structure (III) and structure (V) are present up to about 25 mole % of the phenolic resin component's repeat units.

In another aspect of this embodiment, the repeat unit having structure (VI) is present up to about 20 mole %. In a further aspect, the repeat unit of structure (VI) is present up to about 10 mole %.

In another aspect of this embodiment, the sum of the mole % of repeat unit having structures (III) and (V) does not exceed 10% of the mole % of repeat unit of structure (I).

In another aspect of this embodiment, nb, nh, no and nq are each 0.

In another aspect of this embodiment, Ra, Rg, Rk and Rp are each methyl.

In another aspect of this embodiment, na, ng, nk and np are each 1.

In another aspect of this embodiment, Ri, Rm and Rr are each methyl

In another aspect of this embodiment, Xd is an alkyleneacetal moiety (alkylene-O—CH(CH$_3$)—O—).

In another aspect of this embodiment, Xd is an alkyleneacetal moiety (-alkylene-O—CH(CH$_3$)—O) that includes an the alkylene that is ethylene, propylene, a moiety having structure (VII):

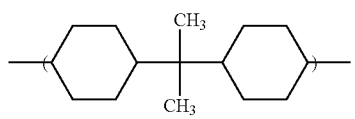

or a moiety having structure (VIIa):

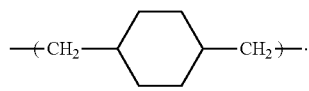

In one aspect, Xd includes a moiety of structure (VII).

In one aspect, Xd includes a moiety of structure (VIIa).

In another aspect of this embodiment, Xd is an alkyleneoxyalkyleneacetal moiety (-alkylene-O-alkylene-O—CH(CH$_3$)—O—). In a further aspect, the alkylene portions thereof are each independently a C-2 to C-8 alkylene moiety. In a further aspect, the alkylene portions thereof are each independently a C-2 to C-4 alkylene moiety. In a further aspect, the alkyleneoxyalkyleneacetal moiety (-alkylene-O-alkylene-O—CH(CH$_3$)—O—) includes a moiety having structure (VIIc):

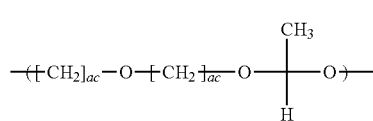

where ac is an integer from 2 to 4. In still another further aspect, the alkyleneoxyalkyleneacetal moiety (-alkylene-O-alkylene-O—CH(CH$_3$)—O—), includes a moiety having structure (VIId):

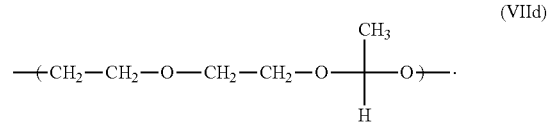

Novolak Resins Functionalized with a Mono-Functional Acetal Moiety and an Acetal Linking Group Attached to a PAC Moiety (PACb)

In another embodiment of any of the above-described having a phenolic resin component that includes repeat units having structures (I) and (II), such phenolic resin component further includes a repeat unit of structure (VI):

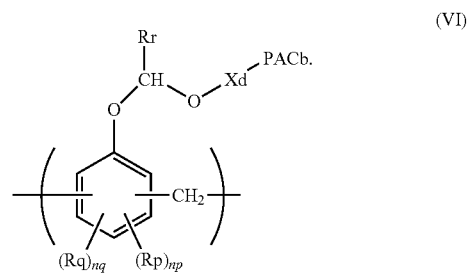

In such an embodiment, for example, (i) Rp is a C-1 to C-4 alkyl, (ii) Rq is a —X-Phenol wherein Xd is —O—, —C(CH$_3$)$_2$—, —(C=O)— or —SO$_2$—, (iii) np is 0 to 3, (iv) nq is 0 or 1 and (v) the sum of np and nq (i.e., np+nq) does not exceed 3. In a further aspect, the repeat unit of structure (VI) is present up to about 20 mole % of the repeat units in the phenolic resin component. In a still further aspect, the repeat unit of structure (VI) is present up to about 10 mole %.

In another aspect of this embodiment, nq is 0.
In another aspect of this embodiment, Rp is methyl.
In another aspect of this embodiment, np is 1.
In another aspect of this embodiment, Rr is methyl.
In another aspect of this embodiment, Xd is an alkyleneacetal moiety (-alkylene-O—CH(CH$_3$)—O—).
In another aspect of this embodiment, Xd is an alkyleneacetal moiety (-alkylene-O—CH(CH$_3$)—O) that includes an the alkylene that is ethylene, propylene, a moiety having structure (VII):

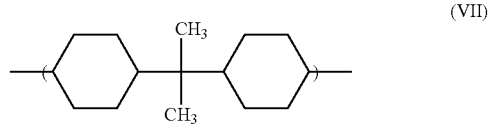

or a moiety having structure (VIIa):

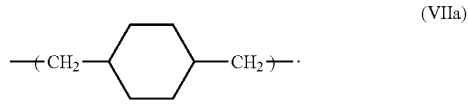

In one aspect, Xd includes a moiety of structure (VII). In one aspect, Xd includes a moiety of structure (VIIa).

In another aspect of this embodiment, Xd is an alkyleneoxyalkyleneacetal moiety (-alkylene-O-alkylene-O—CH(CH₃)—O—). In a further aspect, the alkylene portions thereof are each independently a C-2 to C-8 alkylene moiety. In a further aspect, the alkylene portions thereof are each independently a C-2 to C-4 alkylene moiety. In a further aspect, the alkyleneoxyalkyleneacetal moiety (-alkylene-O-alkylene-O—CH(CH₃)—O—) includes a moiety having structure (VIIc):

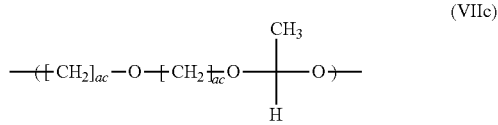

(VIIc)

where ac is an integer from 2 to 4. In still another further aspect, the alkyleneoxyalkyleneacetal moiety (-alkylene-O-alkylene-O—CH(CH₃)—O—) includes a moiety having structure (VIId):

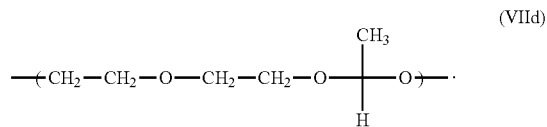

(VIId)

Novolak Resins Linked by Di-Functional Acetal Comprising Moieties Also Comprising Mono-Functional Alkyl Acetal Moieties In another embodiment of any of the above-described having a phenolic resin component that includes repeat units having (a) structures (I), (III), and (IV), (b) structures (I), (III), (IV) and (VI) or (c) structures (I), (III), (V) and (VI), such phenolic resin components can each respectively further include repeat unit of structure (II):

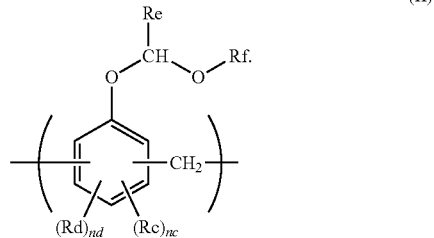

(II)

In such an embodiments, for example, (i) Rc is C-1 to C-4 alkyl, (ii) Rd is a —X-Phenol where X is —O—, —C(CH₃)₂—, —(C=O)— or —SO₂—, (iii) nc is 0 to 3, (iv) nd is 0 or 1, (v) the sum of nc and nd (i.e., nc+nd) does not exceed 3. In a further aspect, Re, Rf and Rr are each independently a C-1 to C-4 alkyl.

In another aspect of this embodiment, the repeat unit of structure (II) is present up to about 40 mole %. In a further aspect, the repeat unit of structure (II) is present up to about 20 mole %.

In another aspect of this embodiment, nd=0.
In another aspect of this embodiment, nc=1.
In another aspect of this embodiment, Re is methyl.
In another aspect of this embodiment, Rf is ethyl.
In another aspect of this embodiment, Rc is ethyl.

In another aspect of this embodiment, where the phenolic resin component has a repeat unit of structure (VI) that includes an attached PACb:

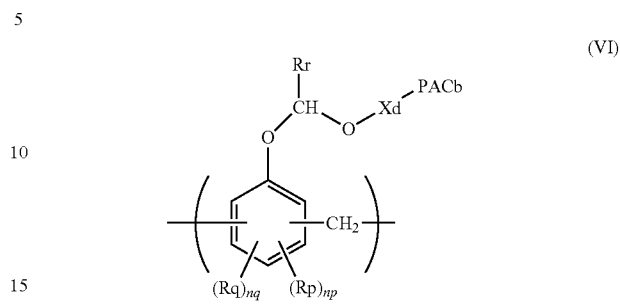

(VI)

the phenolic resin component can further include a free PAC.

In another embodiment of this embodiment having a phenolic resin component that includes repeat units having (a) structures (I), (III), and (IV) or (b) structures (I), (III), (IV) and (VI), the moiety Xa in structure (IV) is an alkylene or an -alkyleneoxyalkylene- moiety. In another aspect, Xa includes the alkylene moiety is ethylene. In another aspect, the moiety Xa is an -alkylene(-O-alkylene)$_{x'}$- moiety where x' is 2 to 6. In another aspect, Xa includes a moiety of structure (VII):

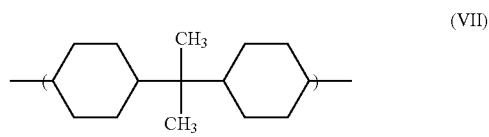

(VII)

In another aspect, Xa includes a moiety of structure (VIIa):

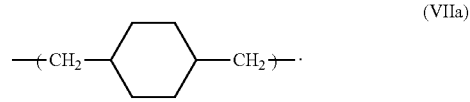

(VIIa)

In another aspect, the Xa includes a moiety of structure (VIIb):

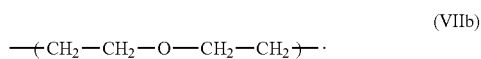

(VIIb)

In another aspect of this embodiment, the PAC component includes a free PAC component.

In another aspect of this embodiment, where the phenolic resin component includes repeat units repeat units having structures (I), (II), (III) and (IV):

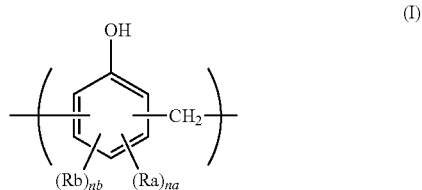

(I)

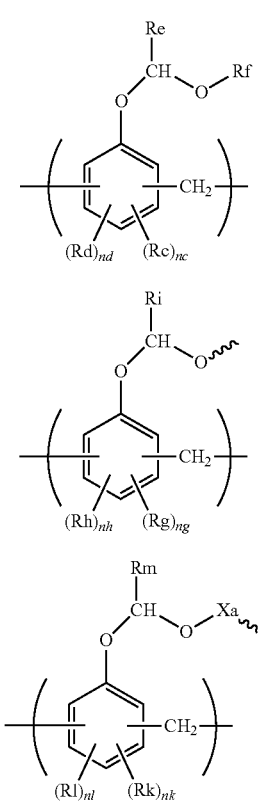

the repeat units having structures (III) and (IV) can be attached together through the positions designated by "〰️" thereby forming a di-functional acetal moiety linking point between two different polymer chains in the phenolic resin component.

In such an embodiment, for example, (i) Ra, Rc, Rg and Rk are each independently a C-1 to C-4 alkyl, (ii) Rb, Rd, Rh and Rl are each independently a —X-Phenol where X is —O—, —C(CH$_3$)$_2$—, —(C=O)— or —SO$_2$—, (iii) na, nc, ng and nk are each independently 0 to 3, (iv) nb, nd, nh and nl are each independently 0 or 1, (v) the sum of na and nb (i.e., na+nb), the sum of nd and nc (i.e nd+nc) the sum of ng and nh (i.e., ng+nh) and the sum of nk and nl (i.e., nk+nl) each respectively does not exceed 3, (vi) Re, Rf, Ri and Rm are each independently selected from a C-1 to C-4 alkyl, (vii) Xa is an alkylene, an -alkyleneoxyalkylene- moiety, or an -alkylene(-O-alkylene)$_{x'}$- moiety where x' is 2 to 6.

In another aspect of this embodiment, the PAC component includes a free PAC component.

In a further aspect, in the repeat unit of structure (II) (i) Rc is C-1 to C-4 alkyl, (ii) Rd is a —X-Phenol where X is —O—, —C(CH$_3$)$_2$—, —(C=O)— or —SO$_2$—, (iii) nc is 0 to 3, (iv) nd is 0 or 1 and (v) the sum of nc and nd (i.e., nc+nd) does not exceed 3. In a further aspect, in the repeat unit of structure (II) of this aspect (i) Re, Rf and Rr are each independently a C-1 to C-4 alkyl, (ii) nb, nd, nh and nl are each independently 0 and (iii) na, nc, ng and nk are each independently 1. In yet a further aspect, Ra, Rc, Rg and Rk are each independently methyl.

In another aspect of this embodiment, the repeat unit of structure (II) may be present up to about 40 mole %. In a further aspect, the repeat unit having structure (II) is present up to about 20 mole %.

In another aspect of this embodiment, the repeat unit having structure (I) is present from about 60 mole % to about 98 mole %. In a further aspect, the repeat unit having structure (I) is present from about 70 mole % to about 98 mole %. In a further aspect, the repeat unit having structure (I) is present from about 70 mole % to about 80 mole %.

In a further aspect, the linking point between two polymer chains of the phenolic resin component that is formed by repeat units of structure (III) and structure (IV) is present up to about 25 mole % of the phenolic resin component's repeat units. In a further aspect, the repeat units of structure (III) and structure (IV) is present up to about 10 mole % of the phenolic resin component's repeat units.

In another aspect of this embodiment, nb, nd, nh and nl are each 0.

In another aspect of this embodiment, na, nc, ng, and nk are each 1.

In another aspect of this embodiment, Ra, Rc, and Rg and Rk are each methyl.

In another aspect of this embodiment, Ri is methyl.

In another aspect of this embodiment, Rm is methyl.

In another aspect of this embodiment, Xa is an alkylene moiety.

In another aspect of this embodiment, Xa is an -alkyleneoxyalkylene- moiety, or an -alkylene(-O-alkylene)$_{x'}$- moiety where x' is 2 to 6.

In another aspect of this embodiment, Xa is an alkylenexoxyalkylene moiety. In a further aspect, Xa includes an -alkyleneoxyalkylene- of structure (VIIb):

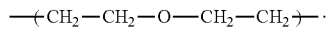

(VIIb)

In another aspect of this embodiment, Xa is an alkyleneacetal moiety (-alkylene-O—CH(CH$_3$)—O) that includes an the alkylene that is ethylene, propylene, a moiety having structure (VII):

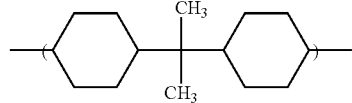

(VII)

or a moiety having structure (VIIa):

(VIIa)

In one aspect, Xa includes a moiety of structure (VII). In one aspect, Xa includes a moiety of structure (VIIa).

II. Free DNQ-PAC Component

As discussed at length above, the DNQ-PAC component can be a single or more than one PACb (i.e., an incorporated element of the acetal moiety protecting the hydroxy groups of the phenolic resin component). However, the PAC component can alternatively or additionally be included in the disclosed and claimed resist compositions as a free PAC that is not bonded to the acetal protecting groups. The PAC component, as a free component, is discussed below.

As was the case for PACb, the free PAC is a substituted or unsubstituted 2,1,5-DNQ material or compound onto which a substituted or unsubstituted 2,1,5-DNQ material is appended and that do not produce sulfonic acid upon UV exposure. FIG. 1 illustrates non-limiting examples of different DNQ-PAC's which may be used as a free PAC component or alternatively be attached to the phenolic resin component as a PACb moiety. In FIG. 1, the moiety D is —H or VIM

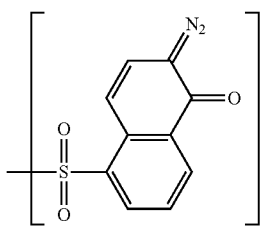

(VIIIa)

where in each compound depicted in this FIG. 1 at least one D is a moiety of structure VIIIa. The attachment of the DNQ-PAC to a phenolic resin component through an acetal moiety may be either through an ether bond, an acetal bond or a carbon-carbon bond.

In one embodiment, the free PAC component is either a single PAC compound, or a mixture of PAC compounds, that includes structure (X):

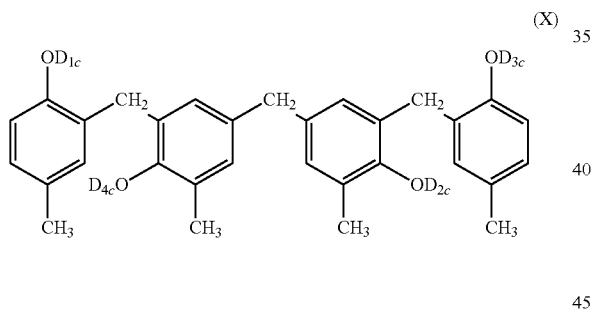

(X)

where (i) $D_{1c}$, $D_{2c}$, $D_{3c}$ and $D_{4c}$ are each independently selected from H or a moiety having structure (VIIIa):

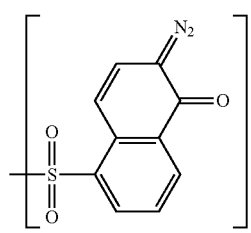

(VIIIa)

and (ii) at least one of $D_{1c}$, $D_{2c}$, $D_{3c}$ or $D_{4c}$ is a moiety including structure (VIIIa).

In another embodiment, the free PAC component is either a single PAC compound, or a mixture of PAC compounds, that include structure (Xa):

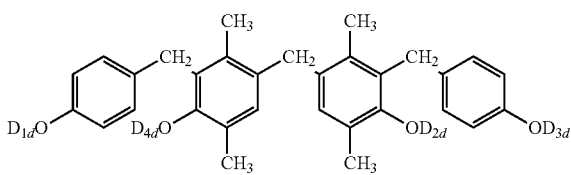

(Xa)

where (i) $D_{1d}$, $D_{2d}$, $D_{3d}$ and $D_{4d}$ are each independently selected from H or a moiety having structure (VIIIa):

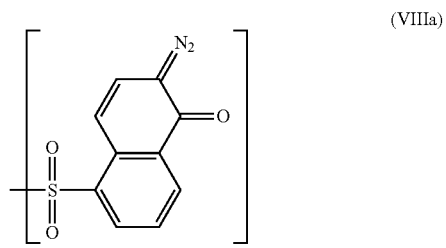

(VIIIa)

and (ii) at least one of $D_{1d}$, $D_{2d}$, $D_{3d}$ or $D_{4d}$ is a moiety including structure (VIIIa).

In another embodiment, the free PAC component is either a single PAC compound, or a mixture of PAC compounds, that include structure (Xb):

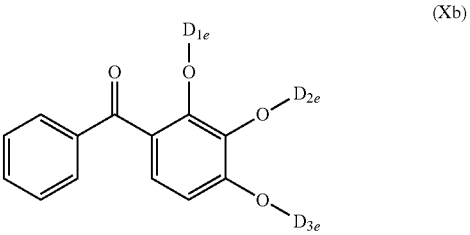

(Xb)

where (i) $D_{1e}$, $D_{2e}$ and $D_{3e}$ are each independently selected from H or a moiety having structure (VIIIa):

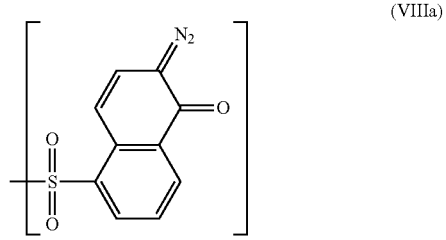

(VIIIa)

and (ii) at least one of $D_{1e}$, $D_{2e}$ or $D_{3e}$ is a moiety including structure (VIIIa).

Embodiments with Specific Combinations of Free PAC Component and Phenolic Resin Component In another embodiment, repeat unit of structure (I):

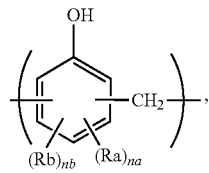
(I)

constitutes from about 90 mole % to about 60 mole % of the repeat units in the phenolic resin component and repeat unit of structure (II):

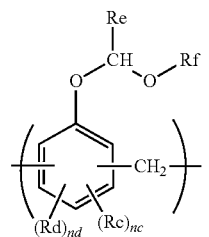
(II)

constitutes from about 10 mole % to about 40 mole % of the repeat units in the phenolic resin component.

In another aspect of this embodiment, the PAC component is only present as a free PAC.

In another aspect of this embodiment, the weight ratio of the phenolic resin component to the free PAC component is from about 95/5 to about 70/30. In a further aspect, the weight ratio is from about 90/10 to about 80/20.

In another aspect of this embodiment, the PAC component includes structure (Xb):

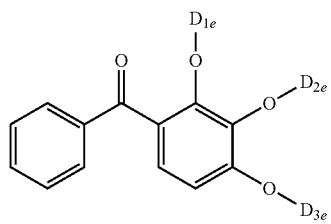
(Xb)

where (i) $D_{1e}$, $D_{2e}$ and $D_{3e}$ are each independently selected from H or a moiety having structure (VIIIa):

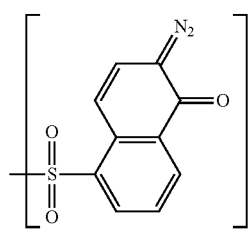
(VIIIa)

and (ii) at least one of $D_{1e}$, $D_{2e}$ or $D_{3e}$ is a moiety having structure (VIIIa).

In a further aspect, the phenolic resin also includes repeat units of structures (III):

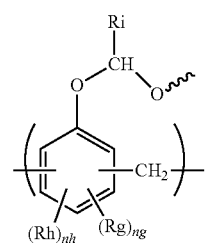
(III)

and (IV):

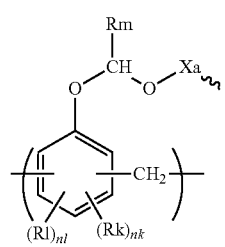
(IV)

at least some of which repeat units combine to form a di-functional acetal moiety linking point between two polymer chains of the phenolic resin component.

In a further aspect of this embodiment, the repeat units of structures (III) and (IV) constitute from about 1 mole % to about 4 mole % of the repeat units in the phenolic resin component.

In another aspect of this embodiment, Xa is an alkyleneacetal moiety (-alkylene-O—CH(CH$_3$)—O—).

In another aspect of this embodiment, Xa is an alkyleneacetal moiety (-alkylene-O—CH(CH$_3$)—O) that includes an the alkylene that is ethylene, propylene, a moiety having structure (VII):

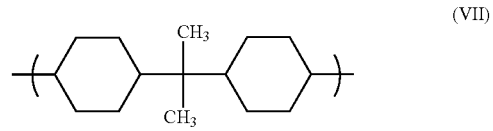
(VII)

or a moiety having structure (VIIa):

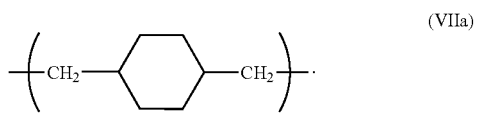
(VIIa)

In one aspect, Xa includes a moiety of structure (VII). In one aspect, Xa includes a moiety of structure (VIIa).

In a further aspect of this embodiment, Xa includes an alkyleneoxyalkylene moiety having structure (VIIb):

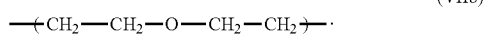
(VIIb)

In another aspect of this embodiment, Xa is an alkyleneoxyalkyleneacetal moiety (-alkylene-O-alkylene-O—CH(CH$_3$)—O—). In a further aspect, the alkylene portions thereof are each independently a C-2 to C-8 alkylene moiety. In a further aspect, the alkylene portions thereof are each independently a C-2 to C-4 alkylene moiety. In a further aspect, the alkyleneoxyalkyleneacetal moiety (-alkylene-O-alkylene-O—CH(CH$_3$)—O—) includes a moiety having structure (VIIc):

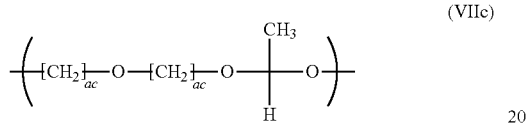
(VIIc)

where ac is an integer from 2 to 4. In still another further aspect, the alkyleneoxyalkyleneacetal moiety (-alkylene-O-alkylene-O—CH(CH$_3$)—O—) includes a moiety having structure (VIId):

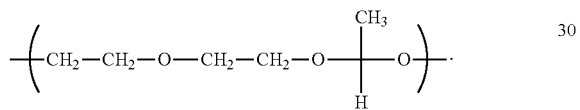
(VIId)

In another aspect of this embodiment, the PAC component includes both a free PAC component and a PACb component. In a further aspect of this embodiment, the phenolic resin also includes a repeat unit of structure (VI):

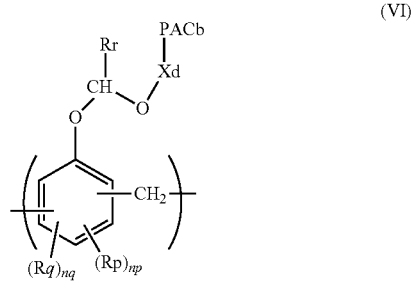
(VI)

with a PACb unit attached thereto. In a further aspect, the PACb moiety includes structure (VIII):

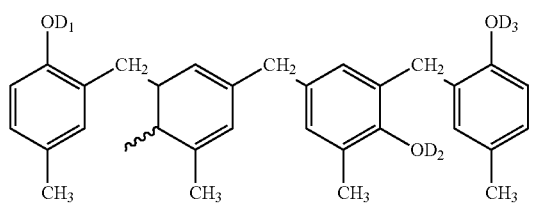
(VIII)

where (i) "∼∼∼" designates an attachment point to a repeat unit of the phenolic resin component, (ii) D$_1$, D$_2$ and D$_3$ are each independently selected from H or a moiety having structure (VIIIa):

(VIIIa)

and (iii) where at least one of D$_1$, D$_2$ or D$_3$ is a moiety having structure (VIIIa). In a further aspect, Xd is selected from the group consisting of:

a) a direct valence bond, b) an alkylene moiety, c) an alkyleneoxy moiety where an alkylene end is attached to an acetal oxygen moiety of the repeat unit of structure (VI) and an oxy end of the alkyleneoxy moiety is attached to the PACb moiety, and d) a moiety comprising an acetal selected from the group consisting of i) an alkyleneacetal moiety (-alkylene-O—CH(CH$_3$)—O—), ii) an alkyleneoxyalkyleneacetal moiety (-alkylene-O-alkylene-O—CH(CH$_3$)—O—), and iii) an alkylene(oligooxyalkylene)acetal moiety (-alkylene-(-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

In a further aspect of this embodiment, the phenolic resin also includes a repeat unit of structure (VI):

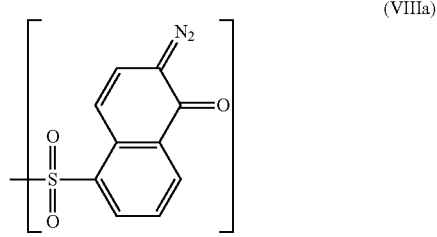
(VI)

with a PACb unit attached thereto. In a further aspect, the PACb moiety includes structure (VIII):

(VIIIc)

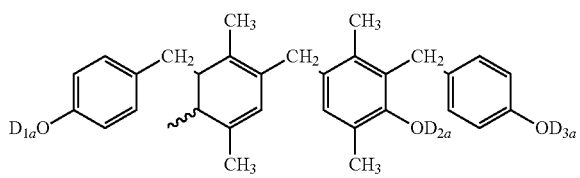

where (i) "∿∿∿" designates an attachment point to a repeat unit of the phenolic resin component, (ii) $D_{1a}$, $D_{2a}$ and $D_{3a}$ are each independently selected from H or a moiety having structure (VIIIa):

(VIIIa)

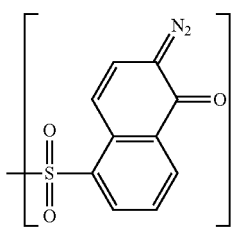

and (iii) where at least one of $D_{1a}$, $D_{2a}$ or $D_{3a}$ is a moiety having structure (VIIIa). In a further aspect, Xd is selected from the group consisting of:
  a) a direct valence bond,
  b) an alkylene moiety,
  c) an alkyleneoxy moiety where an alkylene end is attached to an acetal oxygen moiety of the repeat unit of structure (VI) and an oxy end of the alkyleneoxy moiety is attached to the PACb moiety, and
  d) a moiety comprising an acetal selected from the group consisting of
     i) an alkyleneacetal moiety (-alkylene-O—CH(CH$_3$)—O—),
     ii) an alkyleneoxyalkyleneacetal moiety (-alkylene-O-alkylene-O—CH(CH$_3$)—O—), and
     iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

In a further aspect of this embodiment, the phenolic resin also includes a repeat unit of structure (VI):

(VI)

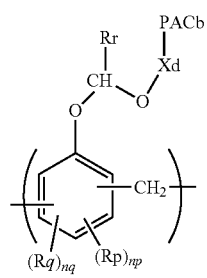

with a PACb unit attached thereto. In a further aspect, the PACb moiety includes structure (VIIId):

(VIIId)

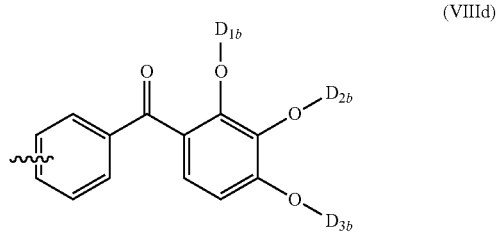

where (i) "∿∿∿" designates an attachment point to a repeat unit of the phenolic resin component, (ii) $D_{1b}$, $D_{2b}$ and $D_{3b}$ are each independently selected from H or a moiety having structure (VIIIa):

(VIIIa)

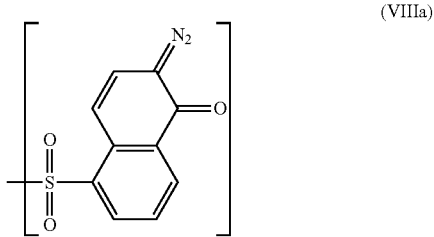

and (iii) where at least one of Dib, Dab or Dab is a moiety having structure (VIIIa). In a further aspect, Xd is selected from the group consisting of:
  a) a direct valence bond,
  b) an alkylene moiety,
  c) an alkyleneoxy moiety where an alkylene end is attached to an acetal oxygen moiety of the repeat unit of structure (VI) and an oxy end of the alkyleneoxy moiety is attached to the PACb moiety, and
  d) a moiety comprising an acetal selected from the group consisting of
     i) an alkyleneacetal moiety (-alkylene-O—CH(CH$_3$)—O—),
     ii) an alkyleneoxyalkyleneacetal moiety (-alkylene-O-alkylene-O—CH(CH$_3$)—O—), and
     iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

In another aspect of this embodiment, the mole % ranges the repeat unit of structure (I) is from about 70 mole % to about 98 mole %; the mole % ranges for the repeat unit of structure (VI), if present, is up to about 10 mole %.

III. Solvent Component

In the above-described resists the solvent component is an organic solvent. Examples of suitable organic solvents include, without limitation, butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, gamma butyrolactone. These solvents may be used singly or in a mixture of two or more.

In one embodiment, the solvent component includes PGMEA (1-Methoxy-2-propanyl acetate). In another embodiment, the solvent component is PGMEA (1-Methoxy-2-propanyl acetate).

IV. Optional Components

The above-described resists can include one or more optional compatible components. Such optional ingredients include, but are not limited to, acid quenchers, auxiliary resins, thiols, plasticizers, surface leveling agents and stabilizers to improve the properties of the resist layer, and the like.

Suitable acid quenchers include, but are not limited to, a basic material or combination of materials such as an amine compound or a mixture of amine compounds having a boiling point above 100° C., at atmospheric pressure, and a $pK_a$ of at least 4.0. Such acid quenchers include, but are not limited to, compounds having structures (XIIa), (XIIb), (XIIc), (XIIe), (XIIf), (XIIg), (XIIh), (XIIi) (XIIj), (XIIk) and (XIII) or a mixture of compounds from this group; wherein $R_{b1}$ is C-1 to C-20 saturated alkyl chain or a C-2 to C-20 unsaturated alkyl chain; $R_{b2}$, $R_{b3}$, $R_{b4}$, $R_{b5}$, $R_{b6}$, $R_{b7}$, $R_{b8}$, $R_{b9}$, $R_{b10}$, $R_{b11}$, $R_{b12}$ and $R_{b13}$, are independently selected from the group of H, and a C-1 to C-20 alkyl as shown below in Table 1.

TABLE 1

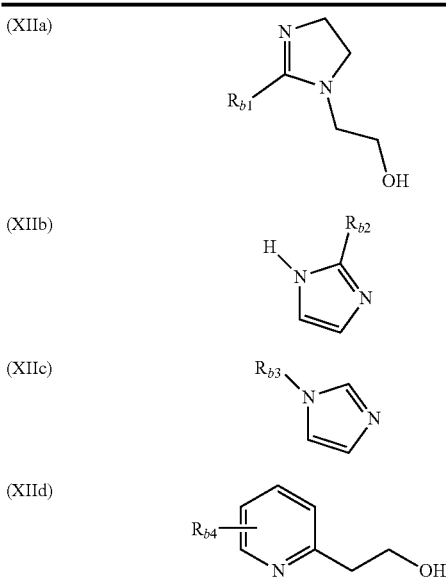
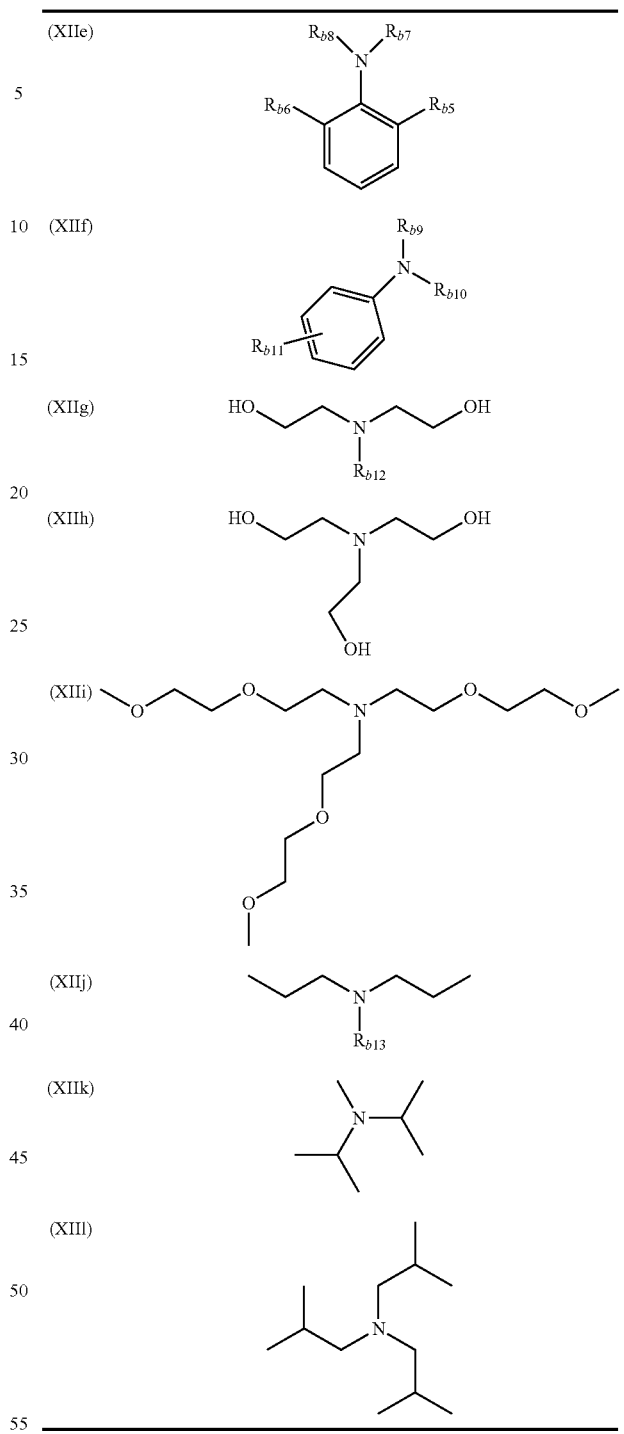

Surface leveling agents may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30 and KH-40 (manufactured by Asahi Glass Co., Ltd.); an organosiloxane polymer such as KP-341, X-70-092 and X-70-093 (manufactured by Shin-Etsu Chemical Co., Ltd.); and an acrylic acid or a methacrylic acid polymer such as Polyflow No. 75 and No. 95 (manufactured by Kyoeisha Chemical Co. Ltd.).

Suitable thiols include, but are not limited to, heterocyclic thiols such as an unsubstituted triazole thiol, a substituted triazole thiol, an unsubstituted imidazole thiol, a substituted imidazole thiol, a substituted triazine thiol, an unsubstituted triazine thiol, a substituted mercapto pyrimidine, an unsubstituted mercapto pyrimidine, a substituted thiadiazole-thiol, an unsubstituted thiadiazole-thiol, a substituted indazole thiol, an unsubstituted indazole thiol, tautomers thereof, and combinations thereof. Examples of suitable thiols include, but are not limited to, 2-thiouracil are further examples. These include, without limitation, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thioracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradodecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-t-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil, 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

Coating Process

Another aspect of the disclosed and claimed subject matter is a process of coating any of this disclosed and/or claimed resist compositions on a substrate. Yet another aspect of the invention is the use of the resist compositions described above for preparing a coated substrate.

Another aspect of the disclosed and claimed subject matter is a process for imaging a resist including the steps of:

(i) coating the resist composition described above on a substrate to form a resist film;

(ii) selectively exposing the resist film to UV light using a mask to form a selectively exposed resist film; and (iii) developing the selectively exposed film to form a positively imaged resist film over the substrate.

Another aspect of the disclosed and claimed subject matter is a process for imaging a resist comprising the steps of:

(ia) coating the resist composition described above on a substrate to form a resist film;

(iia) selectively exposing the resist film to UV light using a mask to form a selectively exposed resist film;

(iiia) baking the selectively exposed resist film to form a baked selectively exposed resist film; and (iva) developing the selectively exposed and baked resist film to form a positively imaged resist film over the substrate.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials

SPN560F is a m-cresol/formaldehyde Novolak, sold under the name Alnovol SPN-560 Fast 44% PGMEA, supplied by Allnex USA Inc. The average molecular weight of this Novolak is MW=8,430 and Mn=1,520. The dissolution rate of the Novolak is 1,200 Å/s in AZ 300MIF developer.

CKS-670, is a bisphenol-A/m-cresol-formaldehyde Novolak sold under the name CKS-670 (C), by Aica Kogyo Company, Limited. The molecular weight of this Novolak is MW=9,034 and Mn=2,195. The dissolution rate of this Novolak is 9000 Å/s in AZ 300MIF developer.

NK-280 is a DNQ-PC sold under this name by TOYO GOSEI., LTD.

It is a mixture of materials having general formula (X) wherein $D_{1c}$, $D_{2c}$, $D_{3c}$ and $D_{3c}$ are individually selected from H or a moiety having structure (VIIIa), where at least one of $D_{1c}$, $D_{2c}$, $D_{3c}$, or $D_{4c}$ is a moiety having structure (VIIIa) and on average about 2.8 of the phenolic positions $D_{1c}$, $D_{2c}$, $D_{3c}$ and $D_{4c}$ groups are esterified with (VIIIa) structure.

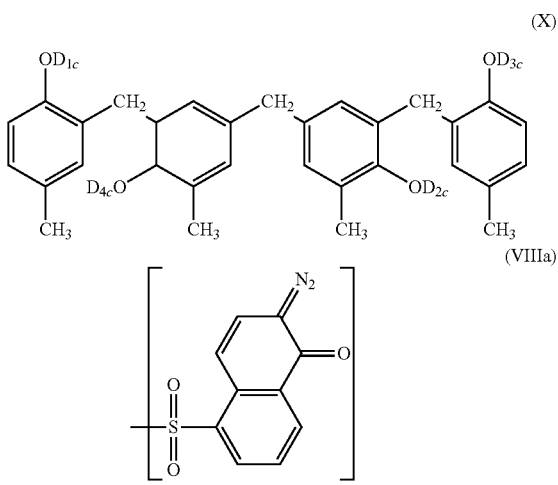

(X)

(VIIIa)

2,3,4-trihydroxy benzophenone-2,1,5-diazonaphthoquinonesulfonate (PW1093) (CAS #68510-93-0) was obtained from Accel Pharmtech East Brunswick, N.J., and is a mixture of materials having general structure (Xb)

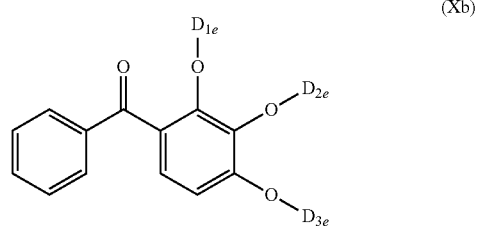

(Xb)

where (i) $D_{1e}$, $D_{2e}$ and $D_{3e}$ are each independently selected from H or a moiety having structure (VIIIa):

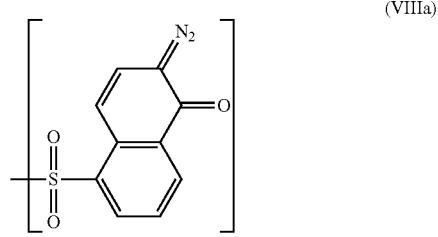

(VIIIa)

PGMEA (1-Methoxy-2-propanyl acetate), the solvent used for photoresist formulation examples was obtained from Sigma-Aldrich a subsidiary of Merck KGaA (Darmstadt, Germany).

APS-430 is a surfactant: from Shinetsu, (Tokyo, Japan).

R-2011 is a surfactant: from DIC Corp (Dusseldorf, Germany).

Monazoline C is an amine quencher (2-(2-heptadecyl-4,5-dihydro-1H-imidazol-1-yl)ethan-1-ol), sold under the commercial name "Monazoline-C," by Croda International plc (Snaith, UK); it has a boiling point at 1 atmosphere of ~489° C. and a pKa in water of ~10.08, and has the following structure:

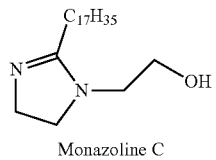

Monazoline C

AZ 300MIF developer was obtained from EMD Performance Materials Corp, a subsidiary of Merck KGaA (Darmstadt, Germany) (a.k.a. 2.38% Tetramethylammonium hydroxide (TMAH)).

PD-126A is a m-cresol/formaldehyde sold under the name Durite™ Resin D_HEXION PD-126A by HEXION (Columbus, Ohio).

APS-437 is a surfactant: from Shinetsu, (Tokyo, Japan).

2,3,4-trihydroxy benzophenone-2,1,5-diazonaphthoquinonesulfonate (PW1093) (CAS #68510-93-0) was obtained from Accel Pharmtech East Brunswick, N.J.

PT395 2,3,4,4'-Tetrahydroxybenzophenone ester with 6-diazo-5,6-dihydro-5-oxo-1-naphthalene sulfonic acid, Toyo-Gosei, Tokyo, Japan.

All other chemical unless otherwise not were obtained from Sigma-Aldrich a subsidiary of Merck KGaA (Darmstadt, Germany).

Megaface R2011 from DIC Corporation, Tokyo, Japan

Molecular weights of polymers were measured with Gel Permeation Chromatography (GPC) using a universal calibration method, calibrated to polystyrene standards.

POLYMER SYNTHESIS EXAMPLES

Synthetic Example 1: Preparation of Ethoxyethyl-Protected Novolac Resin

A 2 L round-bottom flask was charged with (i) 500 g of Novolac resin (SPN560F, 47.2 wt % in PGMEA) and (ii) an additional 225.4 g of PGMEA and then stirred to form a clear solution. Then, 28.3 g (0.2 equivalents based on Novolac resin) of ethyl vinyl ether was added to the solution with stirring. After mixing, 77 mg of p-toluenesulfonic acid monohydrate was added. The mixture was then allowed to react at room temperature for 4 hours in a closed system. The reaction was stopped by adding 1.44 g of 10.0 wt % TMEEA (tris[2-(2-methoxyethoxy)ethyl]amine) solution in PGMEA (1.1 equivalent to p-toluenesulfonic acid monohydrate) all at once. The resulting solution contained approximately 35.0% by weight of ethoxyethyl-protected Novolac resin. The resulting resin had a number average molecular weight ($M_n$) of 1,496 g/mol and a weight average molecular weight ($M_w$) of 8,651 g/mol (measured by GPC). A photoresist formulation was subsequently prepared by directly using the product as prepared.

Synthetic Example 2: Preparation of Ethoxyethyl-Protected Novolac Resin Cross-Linked by Diethylene Glycol A 250 mL round-bottom flask was charged with (i) 50.0 g of Novolac resin (SPN560F, 47.2 wt % in PGMEA) and (ii) an additional 23.07 g of PGMEA and then stirred to form a clear solution. Then, 2.83 g (0.2 equivalents based on Novolac resin) of ethyl vinyl ether and 0.42 g (0.02 equivalent based on Novolac resin) of diethylene glycol were added to the solution with stirring. After mixing, 9.2 mg of p-toluenesulfonic acid monohydrate was added. The reaction was stirred at room temperature for overnight in a closed system. The reaction was stopped by adding 0.17 g of 10.0 wt % TMEEA (tris[2-(2-methoxyethoxy)ethyl]amine) solution in PGMEA (1.1 equivalent to p-toluenesulfonic acid monohydrate) all at once. The resulting solution contained approximately 34.97% by weight of ethoxyethyl-protected Novolac resin. The resulting resin had a number average molecular weight ($M_n$) of 1,608 g/mol and a weight average molecular weight ($M_w$) of 11,349 g/mol (measured by GPC). A photoresist formulation was subsequently prepared by directly using the product as prepared.

Synthetic Example 3: Preparation of Ethoxyethyl-Protected Novolac Resin

A 2 L round-bottom flask was charged with (i) 360.5 g of m-cresol/formaldehyde Novolak resin (PD-126A from HEXION) and (ii) 789.9 g of PGMEA and then stirred to form a clear solution. Then, 64.9 g of ethyl vinyl ether was added to the solution with stirring. After mixing, 176.2 mg of p-toluenesulfonic acid monohydrate was added. The reaction was stirred at room temperature for overnight in a closed system. The reaction was stopped by adding 3.3 g of 10.0 wt. % tris[2-(2-methoxyethoxy)ethyl]amine solution in PGMEA. The resulting solution contained approximately 34.9% by weight of ethoxyethyl-protected Novolak resin. The resulting resin had a number average molecular weight ($M_n$) of 980 g/mol and a weight average molecular weight ($M_w$) of 2,257 g/mol. A photoresist formulation was subsequently prepared by directly using the product as prepared.

FORMULATION EXAMPLES

Example 1: (PW1032, No PEB)

A CAR composition was prepared by dissolving 21.05 g of 35% ethoxyethyl ether protected Novolac resin in PGMEA (Polymer synthesis Example 1), 1.30 g of 2,3,4-trihydroxy benzophenone-2,1,5-diazonaphthoquinone-sulfonate (PW1093), 1.23 g of 5% Monazoline C in PGMEA and 0.2 g of 10% Megaface R2011 in PGMEA 0.2 g and 13.4 g of PGMEA.

The CAR composition was spin coated on a silicon substrate and baked at 90° C./90 sec. It was then exposed with an Ultratech gh-line stepper with mask, developed with AZ 300MIF developer (2.38% tetramethylammonium hydroxide aqueous solution) for 60 sec. 0.8 µmL was resolved at 110 mJ.

Example 2: (PT395, No PEB)

A CAR composition was prepared by dissolving 21.05 g of 35% ethoxyethyl ether protected Novolac resin linked by diethylene glycol in PGMEA (Polymer synthesis Example 2), 1.30 g of PT395, 1.23 g of 5% Monazoline C in PGMEA, 0.2 g of 10% Megaface R2011 in PGMEA and 13.4 g of PGMEA.

The CAR composition was spin coated on a silicon substrate and baked at 90° C./90 sec. It was then and exposed with an Ultratech gh-line stepper with mask and developed with AZ 300MIF developer (2.38% tetramethylammonium hydroxide aqueous solution) for 60 sec. 0.1 µmL was resolved at 160 mJ.

Example 3: (PW1093,—No PEB)

A CAR composition was prepared by dissolving 10.2 g of 35% ethoxyethyl ether protected Novolac resin in PGMEA (Polymer Synthesis Example 3), 1.98 g of 20% 2,3,4-trihydroxy benzophenone-2,1,5-diazonaphthoquinone-sulfonate (PW1093) in PGMEA, 0.18 g of 5% Monazoline C in PGMEA, 0.09 g of 10% Megaface R2011 in PGMEA and 5.554 g of PGMEA.

The CAR composition was spin coated on a silicon substrate and baked at 90° C./90 sec. IT was then exposed with Ultratech gh-line stepper with mask and developed with AZ 300MIF developer (2.38% tetramethylammonium hydroxide aqueous solution) for 60 sec. 2 µmL was obtained at 35 mJ.

Example 4: (PW1093, No PEB)

A CAR composition was prepared by dissolving 9.62 g of 35% ethoxyethyl ether protected Novolac resin in PGMEA (Polymer Synthesis Example 3), 2.97 g of 20% 2,3,4-trihydroxy benzophenone-2,1,5-diazonaphthoquinone-sulfonate in PGMEA, 0.18 g of 5% Monazoline C in PGMEA, 0.09 g of 10% Megaface R2011 in PGMEA and 5.554 g of PGMEA.

The CAR composition was spin coated on a silicon substrate and baked at 90° C./90 sec. It was then exposed with an Ultratech gh-line stepper with mask and developed with AZ 300MIF developer (2.38% tetramethylammonium hydroxide aqueous solution) for 60 sec. 1 µmL was obtained at 35 mJ.

Example 5: (PW1093, No PEB)

A CAR composition was prepared by dissolving 9.06 g of 35% ethoxyethyl ether protected Novolac resin in PGMEA (Polymer synthesis Example 3), 3.96 g of 20% 2,3,4-trihydroxy benzophenone-2,1,5-diazonaphthoquinone-sulfonate in PGMEA, 0.18 g of 5% Monazoline C in PGMEA, 0.09 g of 10% Megaface R2011 in PGMEA and 4.91 g of PGMEA.

The CAR composition was spin coated on a silicon substrate and baked at 90° C./90 sec. It was then exposed with an Ultratech gh-line stepper with mask and developed with AZ 300MIF developer (2.38% tetramethylammonium hydroxide aqueous solution) for 60 sec. 0.7 µmL was obtained at 50 mJ.

Example 6: (PD126A-PW1093, No PEB)

A CAR composition was prepared by dissolving 1.58 g of 35% Ethoxyethyl ether protected Novolac resin in PGMEA (Polymer Synthesis Example 2), 8.0 g of 35% ethoxyethyl ether protected Novolac resin in PGMEA (Polymer Synthesis Example 3), 2.97 g of 20% 2,3,4-trihydroxy benzophenone-2,1,5-diazonaphthoquinonesulfonate in PGMEA, 0.18 g of 5% Monazoline C in PGMEA, 0.09 g of 10% Megaface R2011 in PGMEA and 5.13 g of PGMEA.

The CAR composition was spin coated on a silicon substrate and baked at 90° C./90 sec. It was then exposed with an Ultratech gh-line stepper with mask and developed with AZ 300MIF developer (2.38% tetramethylammonium hydroxide aqueous solution) for 60 sec. 0.8 µmL was obtained at 50 mJ.

Example 7: (PW1093/TOA, No PEB)

A CAR composition was prepared by dissolving 9.05 g of 35% ethoxyethyl ether protected Novolac resin crosslinked with diethyleneglycol in PGMEA (Polymer Synthesis Example 2), 0.786 g of 2,3,4-trihydroxy benzophenone-2, 1,5-diazonaphthoquinonesulfonate, 0.275 g of 1% trioctylamine in PGMEA, 0.089 g of 10% Megaface R2011 in PGMEA and 7.79 g of PGMEA.

The CAR composition was spin coated on a silicon substrate and baked at 110° C./90 sec. It was then exposed with an ASML i-line stepper with mask and developed with AZ 300MIF developer (2.38% tetramethylammonium hydroxide aqueous solution) for 60 sec. 0.8 μmL was obtained at 60 mJ.

Example 8: (PW1093/TOA, No PEB)

A CAR composition was prepared by dissolving 9.61 g of 35% ethoxyethyl ether protected Novolac resin crosslinked with diethyleneglycol in PGMEA (Polymer Synthesis Example 2), 0.585 g of 2,3,4-trihydroxy benzophenone-2,1,5-diazonaphthoquinonesulfonate, 0.282 g of 1% trioctylamine in PGMEA, 0.089 g of 10% Megaface R2011 in PGMEA and 7.43 g of PGMEA.

The CAR composition was spin coated on a silicon substrate and baked at 110° C./90 sec. It was then exposed with an ASML i-line stepper with mask and developed with AZ 300MIF developer (2.38% tetramethylammonium hydroxide aqueous solution) for 60 sec. 0.8 μmL was obtained at 65 mJ.

Example 9: (PW1093/TOA, No PEB)

A CAR composition was prepared by dissolving 9.61 g of 35% ethoxyethyl ether protected Novolac resin crosslinked with diethyleneglycol in PGMEA (Polymer Synthesis Example 2), 0.589 g of 2,3,4-trihydroxy benzophenone-2,1,5-diazonaphthoquinonesulfonate, 0.553 g of 1% trioctylamine in PGMEA, 0.089 g of 10% Megaface R2011 in PGMEA and 7.15 g of PGMEA.

The CAR composition was spin coated on a silicon substrate and baked at 110° C./90 sec. It was then exposed with an ASML i-line stepper with mask and developed with AZ 300MIF developer (2.38% tetramethylammonium hydroxide aqueous solution) for 60 sec. 1 μmL was obtained at 65 mJ.

Example 10: T891 (PW1093, No PEB)

A CAR composition was prepared by dissolving 9.61 g of 35% ethoxyethyl ether protected Novolac resin crosslinked with diethyleneglycol in PGMEA (Polymer Synthesis Example 2), 0.593 g of 2,3,4-trihydroxy benzophenone-2,1,4-diazonaphthoquinonesulfonate and 7.78 g of PGMEA.

The CAR composition was spin coated on a silicon substrate and baked at 110° C./90 sec. IT was then exposed with an ASML i-line stepper with mask and developed with AZ 300MIF developer (2.38% tetramethylammonium hydroxide aqueous solution) for 60 sec. 0.8 μmL was obtained at 50 mJ.

Example 11: T447 (PW1093, No PEB)

A CAR composition was prepared by dissolving 6.82 g of 50% ethoxyethyl ether protected p-hydroxystyrene in PGMEA (Polymer Synthesis Example), 0.595 g of 2,3,4-trihydroxy benzophenone-2,1,5-diazonaphthoquinonesulfonate and 10.6 g of PGMEA.

The CAR composition was spin coated on a silicon substrate and baked at 90° C./90 sec. It was then exposed with an Ultratech gh-line stepper with mask and developed with AZ 300MIF developer (2.38% tetramethylammonium hydroxide aqueous solution) for 60 sec. 1 μmL was obtained at 120 mJ.

Example 12: H159 (NK280=90/10, PGMEA)

A CAR composition was prepared by dissolving 18.05 g of 35% ethoxyethyl ether protected Novolak resin in PGMEA (Polymer Synthesis Example 2), 0.70 g of 3,3'-Bis (2-hydroxy-5-methylbenzyl)-4,4'-dihydroxy-5,5'-dimethyl-diphenylmethane ester with 6-diazo-5,6-dihydro-5-oxo-1-naphthalenesylfonic acid (NK-280 from Toyo Gosei) and 1.25 g of PGMEA.

The CAR composition was spin coated on a silicon substrate (FT=6.4 μm) and soft baked at 110° C./120 sec. It was then exposed with an ASML i-line stepper with mask and developed with AZ 300MIF developer for 90 sec. A 1.50 μm L/S (1:1) resist pattern was obtained at 260 mJ/cm$^2$.

Comparative Example 1: (Acetal PHS/TOA, No PEB)

A CAR composition was prepared by mixing 40% ethoxyethyl ether protected p-hydroxystyrene in PGMEA 25 g, 4-isoprolylthio-N-(1,8-naphthalimide) trifluoromethane sulfonate (113T) 0.1 g, 5% trioctylamine in PGMEA 0.4 g and PGMEA 24.5 g. This CAR composition was spin coated on a silicon substrate, baked at 90° C./90 sec and exposed with ASML i-line stepper with mask and developed with AZ 300MIF developer (2.38% tetramethylammonium hydroxide aqueous solution) for 60 sec. only 2 μm Line/Space(L/S)=1:1 pattern was obtained at 40 mJ. This pattern when not subjected to a post-exposure bake prior to development, showed pronounced line slimming? and/or T-topping. This was seen to become worse with increasing delay between exposure and development. This deleterious effect because pronounced even after a delay of only 30 minutes.

Comparative Example 2: (Acetal Novolac TOA, No PEB)

Figure 13:
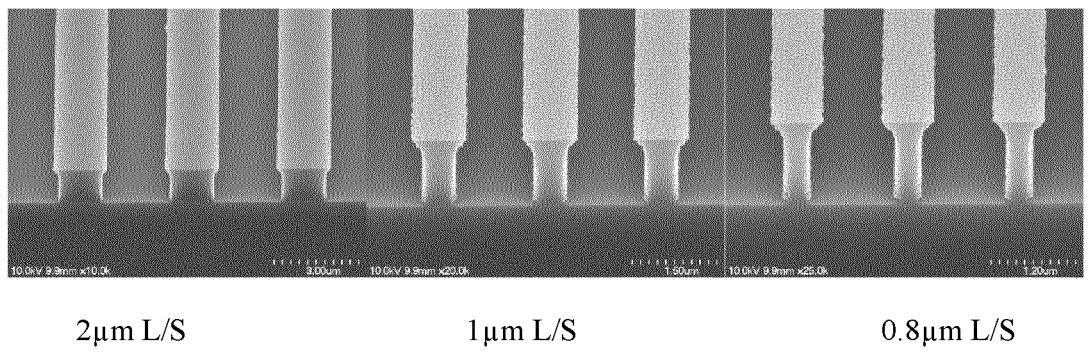
FIG. 13 Cross-section SEM pictures obtained with comparative Example 2, showing T-topped lines after a delay of only 30 minutes after exposure before development.

A CAR composition was prepared by mixing 8.48 g of 35% ethoxyethyl ether protected Novolac in PGMEA (Polymer Synthesis Example 1), 3.0 g of 1% 4-isoprolylthio-N-(1,8-naphthalimide) trifluoromethane sulfonate in PGMEA, 0.257 g of 1% trioctylamine in PGMEA and 3.37 g of PGMEA. This CAR composition was spin coated on a silicon substrate and baked at 90° C./90 sec. It was then exposed with an ASML i-line stepper with mask and developed with AZ 300MIF developer (2.38% tetramethylammonium hydroxide aqueous solution) for 60 sec. A 2 μm Line/Space 1:1 pattern was obtained at 140 mJ, 1 μmL, 0.8 μm L/S were obtained as well, however all patterns showed T-top and they were not usable. Also, this pattern when not subjected to a post-exposure bake prior to development, showed pronounced line slimming and T-topping. FIG. 13 shown the pronounced T-topping which was observed for the L/S features resolved with this comparative formulation. This T-topping was seen to become worse with increasing delay between exposure and development. As seen in FIG. 13, this deleterious effect because pronounced even after a delay of only 30 minutes.

In summary, for the Comparative Examples, both these formulations which comprised a PAG component photo-generating a strong acid, even in the presence of a basic quencher component, when omitting a post exposure bake, showed poor imageability and further did not show post exposure delay latitude between exposure and development. In contrast, the inventive formulations without a PAG containing a 2,1,5 diazonaphthoquinonesulfonate, even in the absence of a basic quencher additive, showed both good imageability and good post exposure delay latitude between exposure and development without a post-exposure bake (up to at least 60 minutes).

In contrast, the disclosed CARs include an acetal protected or acetal crosslinked Novolak, or an acetal protected poly-hydroxystyrene resin, a DNQ, solvent and optionally a base. As shown in the examples, a pattern was formed without extra PAG at room temperature. The deprotection reaction proceeded by the weak acid generated from DNQ and lithographic performance, such as resolution, sensitivity, PED stability was unexpectedly improved. Moreover, the disclosed CARs do not require the use expensive PAGs.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:

1. A photoacid generator (PAG)-free resist composition comprising:
   (A) a phenolic resin component, selected from the group consisting of
   a phenolic resin component which comprises repeat units having structures (I), (III) and (V),
   a phenolic resin component which comprises repeat units having structures (I), (II) and (VI),
   a phenolic resin component which comprises repeat units having structures (I), (III), (IV) and (VI), and
   a phenolic resin component which comprises repeat units having structures (I), (III), (V) and (VI),

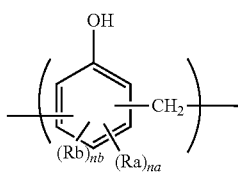
(I)

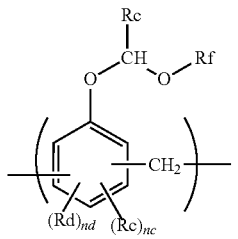
(II)

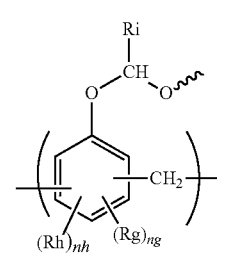
(III)

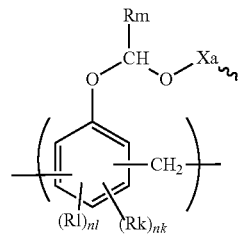
(IV)

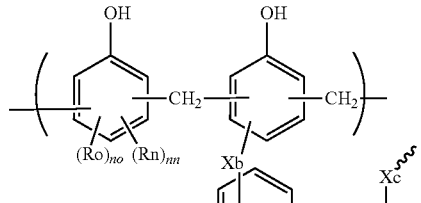
(V)

and

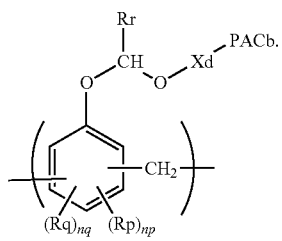
(VI)

wherein

Ra, Rc, Rg, Rk, Rn and Rp are each independently a C-1 to C-4 alkyl,

Rb, Rd, Rh, Rl, Ro, and Rq are each independently a —X-Phenol where X is —O—, —C(CH$_3$)$_2$—, —(C=O)— or —SO$_2$—, na, nc, ng, nk, nn and np are each independently 0 to 3, the sum of na and nb, the sum of nc and nd, the sum of ng and nh, the sum of nk and nl, the sum nn and no, the sum of np and nq and each respectively does not exceed 3, Re, Rf, Ri, Rm, Rm2, and Rr are each independently selected from a C-1 to C-4 alkyl, where nb, nd, nh, no and nq are 0 or 1, the repeat units having structures (III) is attached to either the repeat unit of structure (IV) or the repeat unit of structure (V) through the positions designated by " ∿∿∿ " thereby forming a di-functional acetal moiety providing a linking point in the phenolic resin component between two different polymer chains, Xa is an alkylene, an —alkyleneoxyalkylene- moiety or an —alkylene (—O—alkylene)$_{x'}$-moiety where x' is 2 to 6, Xb is —O—, —C(CH$_3$)$_2$—, —(C=O)— or —SO$_2$—, Xc is an alkylene, an —alkyleneoxyalkylene— moiety or an —alkylene(—O—alkylene)$_{x'}$-moiety where x' is 2 to 6, PACb is a PAC component in the repeat unit having structure (VI) attached through a linking group Xd, wherein Xd is selected from the group consisting of:
a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and d) a moiety comprising an acetal selected from the group consisting of
i) an alkyleneacetal moiety (—alkylene—O—CH(CH$_3$)—O—),
ii) an alkyleneoxyalkyleneacetal moiety (—alkylene—O—alkylene—O—CH(CH$_3$)—O—), and
iii) an alkylene (oligooxyalkylene) acetal moiety (-alkylene (—O—alkylene)$_x$—O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety (B) a photoactive non-sulfonic acid generating (PAC) component comprising 2,1,5-diazonaphthoquinonesulfonate moiety or a derivative thereof, wherein the PAC component is one or more of:

the acetal moiety functionalized with a PAC moiety, and
a free PAC component; and
(C) a solvent component,
wherein the composition is free of added photoacid generators (PAGs).

2. The composition of claim 1 consisting of:
(A) a phenolic resin component, selected from the group consisting of
a phenolic resin component which comprises repeat units having structures (I), (III) and (V),
a phenolic resin component which comprises repeat units having structures (I), (II) and (VI),
a phenolic resin component which comprises repeat units having structures (I), (III), (IV) and (VI), and
a phenolic resin component which comprises repeat units having structures (I), (III), (V) and (VI),

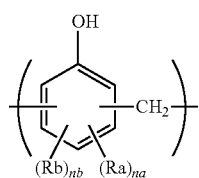

(I)

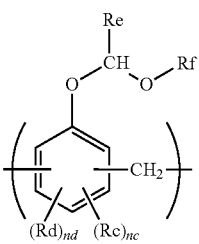

(II)

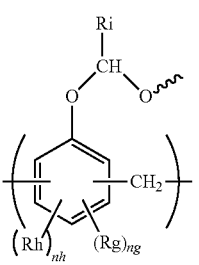

(III)

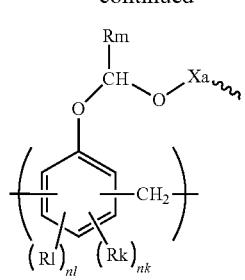

(IV)

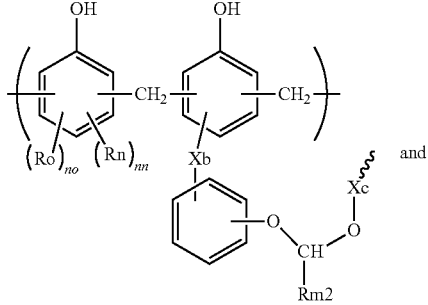

and

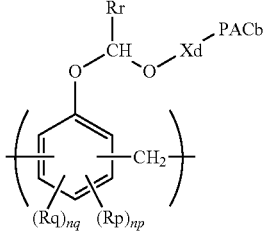

(VI)

wherein
Ra, Rc, Rg, Rk, Rn and Rp are each independently a C-1 to C-4 alkyl,
Rb, Rd, Rh, Rl, Ro, and Rq are each independently a —X—Phenol where X is —O—, —C(CH$_3$)$_2$—, —(C=O)— or —SO$_2$—,
na, nc, ng, nk, nn and np are each independently 0 to 3, the sum of na and nb, the sum of nc and nd, the sum of ng and nh, the sum of nk and nl, the sum nn of and no, the sum of np and nq and each respectively does not exceed 3,
Re, Rf, Ri, Rm, Rm2, and Rr are each independently selected from a C-1 to C-4 alkyl, where nb, nd, nh, no and nq are 0 or 1,
the repeat units having structures (III) is attached to either the repeat unit of structure (IV) or the repeat unit of structure (V) through the positions designated by " ∿∿∿ " thereby forming a di-functional acetal moiety providing a linking point in the phenolic resin component between two different polymer chains, prera
Xa is an alkylene, an -alkyleneoxyalkylene- moiety or an -alkylene(-O-alkylene)$_x$-moiety where x' is 2 to 6
(viv) Xb is —O—, —C(CH$_3$)$_2$—, —(C=O)— or —SO$_{2-}$,
Xc is an alkylene, an -alkyleneoxyalkylene- moiety or an -alkylene(-O-alkylene)$_x$- moiety where x' is 2 to 6
the PACb moiety is a PAC component in the repeat unit having structure (VI) attached through a linking group Xd, wherein Xd is selected from the group consisting of:

a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
   i) an alkyleneacetal moiety (-alkylene-O—CH(CH$_3$)—O—),
   ii) an alkyleneoxyalkyleneacetal moiety (-alkylene-O-alkylene-O—CH(CH$_3$)—O—), and
   iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety a photoactive non-sulfonic acid generating (PAC) component comprising a 2,1,5-diazonaphthoquinonesulfonate moiety, or a derivative thereof,
wherein the PAC component is one or more of:
said acetal moiety functionalized with a photoactive non-sulfonic acid generating 2,1,5-diazonaphthoquinonesulfonate (PAC), and
a free PAC component; and
(C) a solvent component,
wherein the composition is free of added photoacid generators (PAGs).

3. The composition of claim 1, wherein the phenolic resin component comprises repeat units having structures (I), (III) and (V),

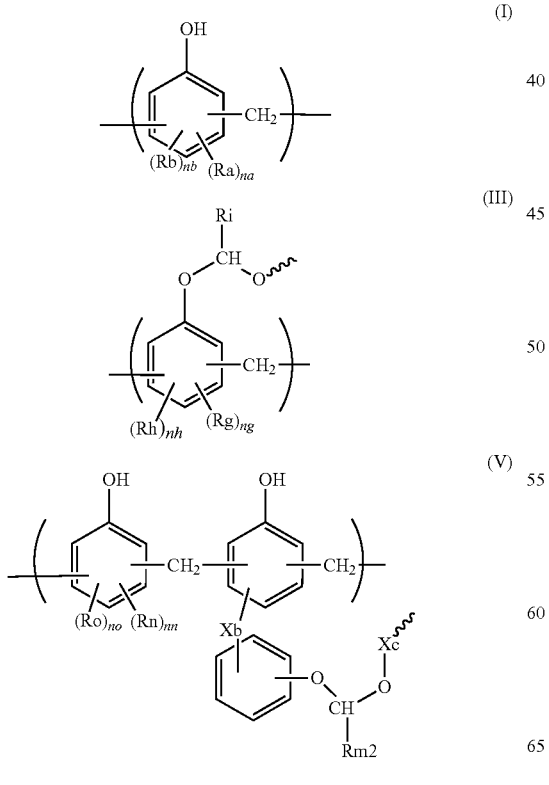

wherein the repeat units having structures (III) and (V) are attached together through the positions designated by "∿∿" thereby forming a di-functional acetal moiety providing a linking point in the phenolic resin component between two different polymer chains, and Ra, Rg and Rn are each independently a C-1 to C-4 alkyl, Rb, Rh and Ro are each independently a —X-Phenol where X is —O—, —C(CH$_3$)$_2$—, —(C=O)— or —SO$_2$—, na, ng and nn are each independently 0 to 3, nb, nh and no are each independently 0 or 1, the sum of na and nb, the sum of ng and nh and the sum of nn and no each respectively does not exceed 3, Ri and Rm2 are each independently selected from a C-1 to C-4 alkyl, Xb is —O—, —C(CH$_3$)$_2$-, —(C=O)— or —SO$_2$—, and Xc is an alkylene, an -alkyleneoxyalkylene- moiety or an -alkylene(-O-alkylene)$_{x'}$- moiety where x' is 2 to 6.

4. The composition of claim 1, wherein the phenolic resin component comprises repeat units having structures (I), (II) and (VI),

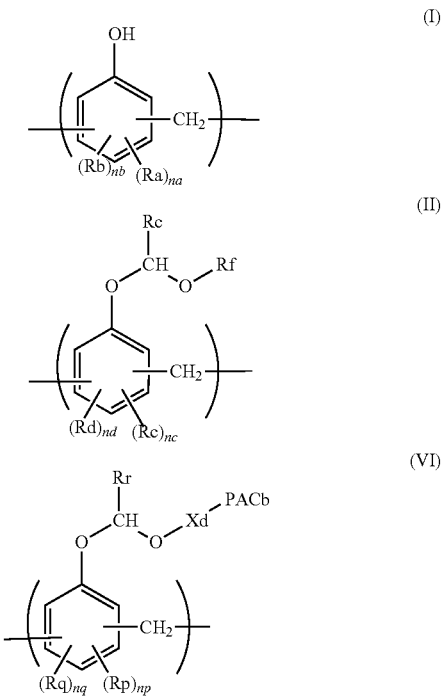

wherein
Ra, Rc and Rp are each independently a C-1 to C-4 alkyl, Rb, Rd, and Rq are each independently a —X-Phenol where X is —O—, —C(CH$_3$)$_2$—, —(C=O)— or —SO$_2$—, na, nc and np are each independently 0 to 3, nb, nd and nq are each independently 0 or 1, the sum of na and nb, the sum of nc and nd and the sum of np and nq each respectively does not exceed 3, Re, Rf and Rr are each independently selected from a C-1 to C-4 alkyl, and the PACb is a PAC component in the repeat unit having structure (VI) attached through a linking group Xd, wherein Xd is selected from the group consisting of:
a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
i) an alkyleneacetal moiety (-alkylene-O—CH(CH$_3$)—O—),
ii) an alkyleneoxyalkyleneacetal moiety (-alkylene-O-alkylene-O—CH(CH$_3$)—O—), and
iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

5. The composition of claim 1, wherein the phenolic resin component comprises repeat units having structures (I), (III), (IV) and (VI)

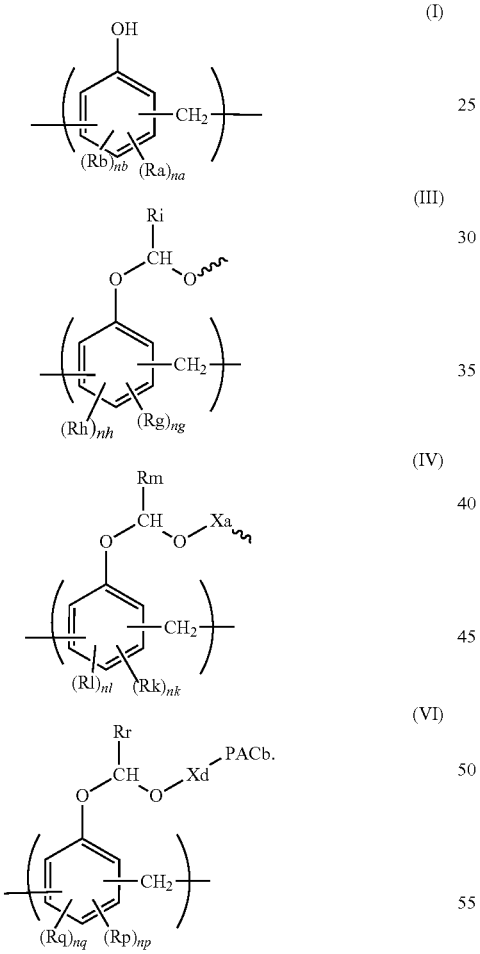

wherein,
the repeat units having structures (III) and (IV) are attached together through the positions designated by "⌇⌇⌇" thereby forming a di-functional acetal moiety providing a linking point in the phenolic resin component between two different polymer chains and wherein,
Ra, Rg, Rk and Rp are each independently a C-1 to C-4 alkyl, and Rb, Rh, Rl and Rq are each independently a —X-Phenol where X is —O—, —C(CH$_3$)$_2$—, —(C=O)— or —SO$_2$—, na, ng, nk and np are each independently 0 to 3, nb, nh, nl and nq are each independently 0 or 1, the sum of na and nb, the sum of nh and ng, the sum of nl and nk and the sum of np and nq each respectively does not exceed 3,
Ri, Rm and Rr are each independently selected from a C-1 to C-4 alkyl and Xa is an alkylene, an -alkyleneoxyalkylene- moiety or an -alkylene(-O-alkylene)$_{x'}$- moiety where x' is 2 to 6 the PACb is a PAC component in the repeat unit having structure (VI) attached through a linking group Xd, wherein Xd is selected from the group consisting of:
a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
i) an alkyleneacetal moiety (-alkylene-O—CH(CH$_3$)—O—),
ii) an alkyleneoxyalkyleneacetal moiety (-alkylene-O-alkylene-O—CH(CH$_3$)—O—), and
iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

6. The composition of claim 5, wherein the phenolic resin component comprises repeat units having structures (I), (III), (V) and (VI)

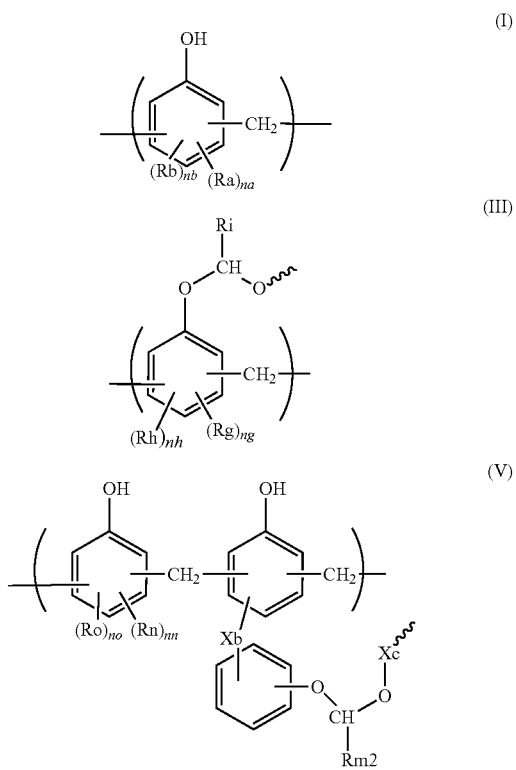

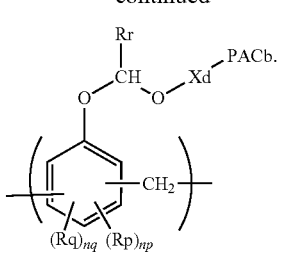

(VI)

wherein,
the repeat units having structures (III) and (V) are attached together through the positions designated by "∿∿∿" thereby forming a di-functional acetal providing a linking point in the phenolic resin component between two different polymer chains and Ra, Rg, Rn and Rp are each independently a C-1 to C-4 alkyl, Rb, Rh, Ro and Rq are each independently a —X-Phenol where X is —O—, —C(CH$_3$)$_2$—, —(C=O)—, or —SO$_2$—, na, ng, nn and np are each independently 0 to 3, nb, nh, no and nq are each independently 0 or 1, and the sum of na and nb, the sum of nn and no, the sum of nl and nk and the sum of np and nq each respectively does not exceed 3, Ri and Rr are independently a C-1 to C-4 alkyl, Xb is —O—, —C(CH$_3$)$_2$—, —(C=O)— or —SO$_2$—, Xc is an -alkylene(-O-alkylene)$_{x'}$- moiety where x' is 2 to 6, and the PACb is a PAC component in the repeat unit having structure (VI) attached through a linking group Xd, wherein Xd is selected from the group consisting of:
a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
i) an alkyleneacetal moiety (-alkylene-O—CH(CH$_3$)—O—),
ii) an alkyleneoxyalkyleneacetal moiety (-alkylene-O-alkylene-O—CH(CH$_3$)—O—), and
iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

7. The composition of claim 1, wherein the phenolic resin is a phenolic resin component which comprises repeat units having structures (I), (II) and (VI), where Rc is C-1 to C-4 alkyl, Rd is a —X—Phenol where X is —O—, —C(CH$_3$)$_2$—, —(C=O)— or —SO$_2$—, nc is 0 to 3, nd is 0 or 1, and the sum of nc and nd does not exceed 3.

8. The composition of claim 1, where said phenolic resin component is a phenolic resin component selected from the group consisting of
a phenolic resin component which comprises repeat units having structures (I), (III) and (V), and
a phenolic resin component which comprises repeat units having structures (I), (III), (V) and (VI), and
where Xc is an alkylene, an —alkyleneoxyalkylene— moiety or an —alkylene(—O—alkylene)$_{x'\text{-moiety}}$ where x' is 2 to 6 and
wherein Xc includes at least one alkylene that is selected from the group consisting of an ethylene moiety, a propylene moiety, a butylene moiety, and a moiety of structure (VII):

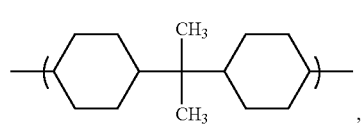

a moiety of structure (VIIa):

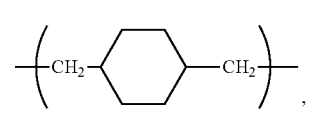

and
a moiety of structure (VIIb):

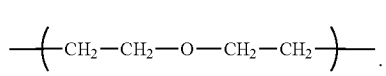

9. The composition of claim 1, wherein said phenolic resin component is a phenolic resin component is selected from the group consisting of
a phenolic resin component which comprises repeat units having structures (I), (III) and (V), and
a phenolic resin component which comprises repeat units having structures (I), (III), (V) and (VI), and
where Xb is —O—, —C(CH$_3$)$_2$—, —(C=O)— or —SO$_2$—.

10. The composition of claim 1, wherein the phenolic resin component comprises repeat units having structure (VI) and is selected from the group consisting of
a phenolic resin component which comprises repeat units having structures (I), (II) and (VI), and
a phenolic resin component which comprises repeat units having structures (I), (III), (IV) and (VI), and
where Xd is selected from the group consisting of
a) a direct valence bond,
b) an alkylene moiety,
c) an alkyleneoxy moiety where an alkylene end is attached to an acetal oxygen moiety of the repeat unit of structure (VI) and an oxy end of the alkyleneoxy moiety is attached to the PACb moiety, and
d) a moiety comprising an acetal selected from the group consisting of
i) an alkyleneacetal moiety (-alkylene-O-CH(CH$_3$)-O-),
ii) an alkyleneoxyalkyleneacetal moiety (-alkylene-O-alkylene-O-CH(CH$_3$)—O—), and
iii) an alkylene(oligooxyalkylene)acetal moiety (-alkylene (-O-alkylene)$_x$-O—CH(CH$_3$)—O—) where x is 2 to 6, and further wherein, the alkylene end of said moiety comprising an acetal is attached to the acetal oxygen moiety of the repeat unit of structure (VI), and the acetal portion of said moiety comprising an acetal is attached to the PACb moiety.

11. The composition of claim 1, where said phenolic resin component is selected from the group consisting of
- a phenolic resin component which comprises repeat units having structures (I), (II) and (VI),
- a phenolic resin component which comprises repeat units having structures (I), (III), (IV) and (VI), and
- a phenolic resin component which comprises repeat units having structures (I), (III), (V) and (VI), and
- where Xd is an alkyleneacetal moiety (-alkylene-O-CH(CH₃)-O) or an an alkyleneoxyalkyleneacetal moiety (-alkylene-O-alkylene-O-CH(CH₃)—O—) and
- wherein Xd includes at least one alkylene that is selected from the group consisting of an ethylene moiety, a propylene moiety, a butylene moiety, and a moiety of structure (VII):

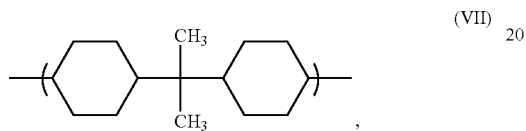

(VII)

a moiety of structure (VIIa):

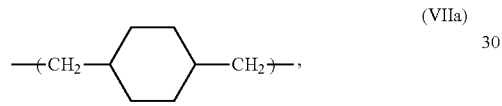

(VIIa)

a moiety having structure (VIIc):

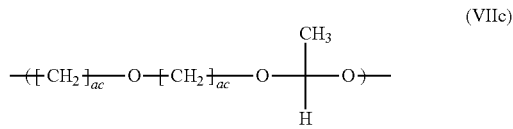

(VIIc)

where ac is an integer from 2 to 4, and
a moiety having structure (VIId):

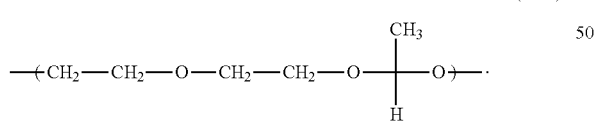

(VIId)

12. The composition of claim 1 where said phenolic resin component is selected from the group consisting of
- a phenolic resin component which comprises repeat units having structures (I), (II) and (VI),
- a phenolic resin component which comprises repeat units having structures (I), (III), (IV) and (VI), and
- a phenolic resin component which comprises repeat units having structures (I), (III), (V) and (VI),
- wherein the photoactive 2,1,5-diazonaphthoquinone-sulfonate (PAC) component comprises a PACb moiety comprising structure (VIII):

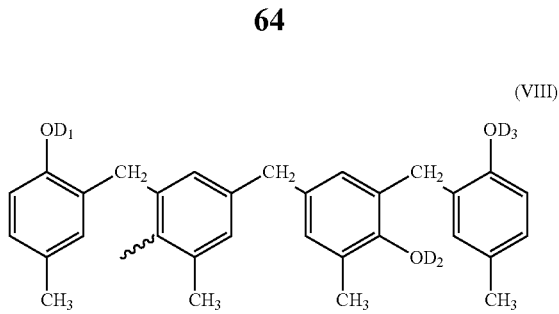

(VIII)

where "∿∿∿" designates an attachment point to a repeat unit of the phenolic resin component, $D_1$, $D_2$ and $D_3$ are each independently selected from H or a moiety having structure (VIIIa):

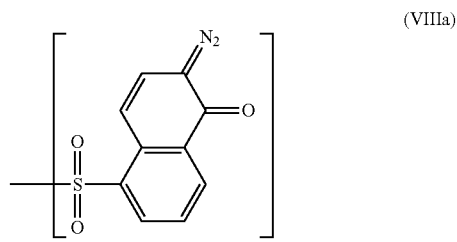

(VIIIa)

and where at least one of $D_1$, $D_2$ or $D_3$ is a moiety having structure (VIIIa).

13. The composition of claim 1, where said phenolic resin component is selected from the group consisting of
- a phenolic resin component which comprises repeat units having structures (I), (II) and (VI),
- a phenolic resin component which comprises repeat units having structures (I), (III), (IV) and (VI), and
- a phenolic resin component which comprises repeat units having structures (I), (III), (V) and (VI),
- wherein the photoactive 2,1,5-diazonaphthoquinone-sulfonate (PAC) component comprises a PACb moiety comprising structure (VIIIc):

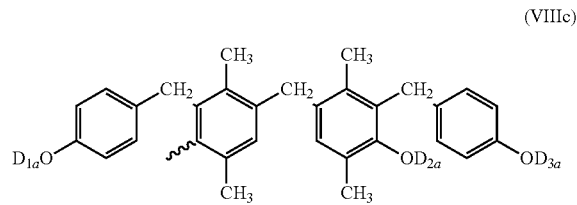

(VIIIc)

where "∿∿∿" designates an attachment point to a repeat unit of the phenolic resin component, $D_{1a}$, $D_{2a}$ and $D_{3a}$ are each independently selected from H or a moiety having structure (VIIIa):

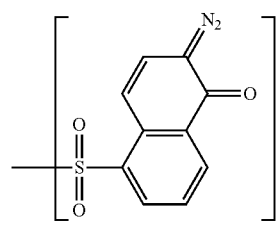

and where at least one of $D_{1a}$, $D_{2a}$ or $D_{3a}$ is a moiety having structure (VIIIa).

14. The composition of claim 1, where said phenolic resin component is selected from the group consisting of a phenolic resin component which comprises repeat units having structures (I), (II) and (VI), a phenolic resin component which comprises repeat units having structures (I), (III), (IV) and (VI), and a phenolic resin component which comprises repeat units having structures (I), (III), (V) and (VI), wherein the photoactive 2,1,5-diazonaphthoquinone-sulfonate (PAC) component comprises a PACb moiety comprising structure (VIIId):

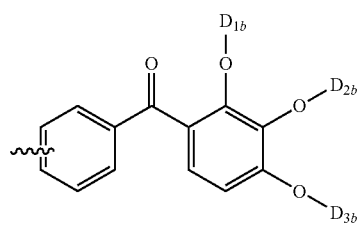

where "⌇" designates an attachment point to a repeat unit of the phenolic resin component, $D_{1b}$, $D_{2b}$ and $D_{3b}$ are each independently selected from H or a moiety having structure (VIIIa):

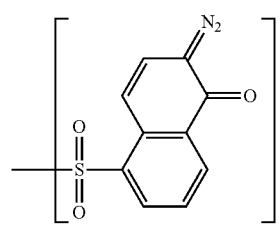

and where at least one of $D_{1b}$, $D_{2b}$ or $D_{3b}$ is a moiety having structure (VIIIa).

15. The composition of claim 1, wherein the photoactive 2,1,5-diazonaphthoquinonesulfonate (PAC) component comprises a compound having structure (X):

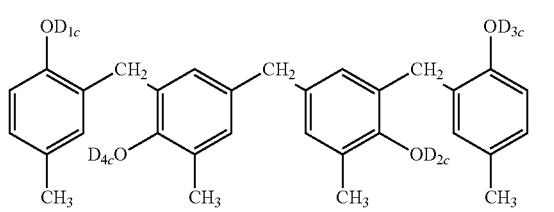

where $D_{1c}$, $D_{2c}$, $D_{3c}$ and $D_{4c}$ are each independently selected from H or a moiety having structure (VIIIa):

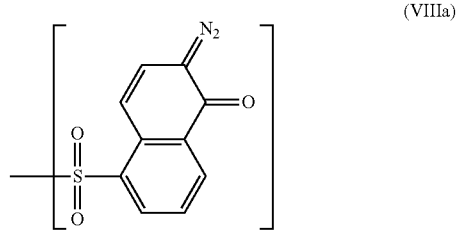

and at least one of $D_{1c}$, $D_{2c}$, $D_{3c}$ or $D_{4c}$ is a moiety including structure (VIIIa).

16. The composition of claim 1, wherein the photoactive 2,1,5-diazonaphthoquinonesulfonate (PAC) component comprises a compound having structure (Xa):

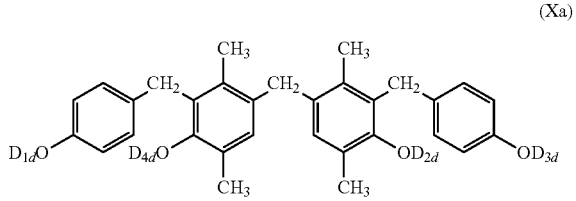

where $D_{1d}$, $D_{2d}$, $D_{3d}$ and $D_{4d}$ are each independently selected from H or a moiety having structure (VIIIa):

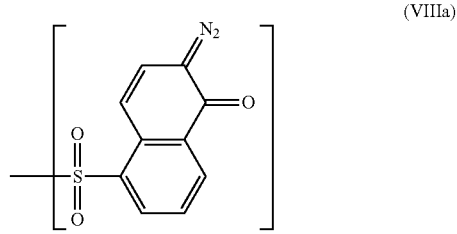

and at least one of $D_{1d}$, $D_{2d}$, $D_{3d}$ or $D_{4a}$ is a moiety including structure (VIIIa).

17. The composition of claim 1, wherein the photoactive 2,1,5-diazonaphthoquinonesulfonate (PAC) component comprises a compound having structure (Xb):

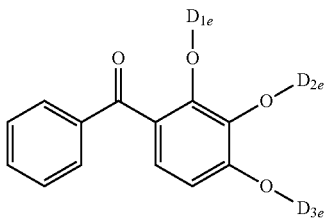
(Xb)

where $D_{1e}$, $D_{2e}$ and $D_{3e}$ are each independently selected from H or a moiety having structure (VIIIa):

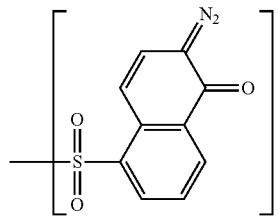
(VIIIa)

and at least one of $D_{1e}$, $D_{2e}$, $D_{3e}$ or $D_{3e}$ is a moiety including structure (VIIIa).

18. The composition of claim 1, wherein a weight ratio of the phenolic resin component to the free PAC component is from 95/5 to 70/30.

19. The composition of claim 1, further comprising a thiol.

20. A process for imaging a resist comprising the steps;
   i) coating the composition of claim 1 on a substrate to form a resist film;
   ii) selectively exposing the resist film to UV light using a mask to form a selectively exposed resist film;
   iii) developing the selectively exposed film to form a positively imaged resist film over the substrate.

21. A process for imaging a resist comprising the steps;
   ia) coating the composition of claim 1 on a substrate to form a resist film;
   iia) selectively exposing the resist film to UV light using a mask to form a selectively exposed resist film;
   iiia) baking the selectively exposed resist film to form a baked selectively exposed resist film;
   iva) developing the selectively exposed and baked resist film to form a positively imaged resist film over the substrate.

* * * * *

UNITED STATES PATENT AND TRADEMARK OFFICE
CERTIFICATE OF CORRECTION

PATENT NO. : 12,360,453 B2
APPLICATION NO. : 17/762597
DATED : March 22, 2022
INVENTOR(S) : Takanori Kudo et al.

Page 1 of 1

It is certified that error appears in the above-identified patent and that said Letters Patent is hereby corrected as shown below:

In the Claims

In Column [56], Line [60], in Claim [2] delete "(viv) Xb" and insert -- Xb --

In Column [57], Line [21], in Claim [2] delete "a photoactive" and insert -- (B) a photoactive --

In Column [62], Line [33], in Claim [9] delete "component is selected" and insert -- component selected --

Signed and Sealed this
Nineteenth Day of August, 2025

Coke Morgan Stewart
*Acting Director of the United States Patent and Trademark Office*